US012563782B2

(12) United States Patent
Lavric et al.

(10) Patent No.: US 12,563,782 B2
(45) Date of Patent: Feb. 24, 2026

(54) FABRICATION OF GATE-ALL-AROUND INTEGRATED CIRCUIT STRUCTURES HAVING COMMON METAL GATES AND HAVING GATE DIELECTRICS WITH DIFFERENTIATED DIPOLE LAYERS

(71) Applicant: Intel Corporation, Santa Clara, CA (US)

(72) Inventors: Dan S. Lavric, Beaverton, OR (US);
Dax M. Crum, Beaverton, OR (US);
YenTing Chiu, Portland, OR (US);
David J. Towner, Portland, OR (US);
David N. Goldstein, Beaverton, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 765 days.

(21) Appl. No.: 17/694,170

(22) Filed: Mar. 14, 2022

(65) Prior Publication Data

US 2023/0290852 A1      Sep. 14, 2023

(51) Int. Cl.
| | |
|---|---|
| *H01L 29/423* | (2006.01) |
| *H01L 29/06* | (2006.01) |
| *H01L 29/786* | (2006.01) |
| *H10D 30/67* | (2025.01) |
| *H10D 62/10* | (2025.01) |
| *H10D 30/62* | (2025.01) |
| *H10D 64/01* | (2025.01) |

(52) U.S. Cl.
CPC ..... *H10D 30/6735* (2025.01); *H10D 30/6757* (2025.01); *H10D 62/121* (2025.01); *H10D 30/62* (2025.01); *H10D 64/017* (2025.01)

(58) Field of Classification Search
CPC ........... H10D 30/6735; H10D 30/6757; H10D 62/121; H10D 30/62; H10D 64/017; H10D 30/014; H10D 30/43; H10D 30/794; H10D 64/685; H10D 64/691; B82Y 10/00; H01L 21/28185
USPC ......................................................... 257/330
See application file for complete search history.

(56) References Cited

U.S. PATENT DOCUMENTS

| | | | | |
|---|---|---|---|---|
| 2019/0371903 A1* | 12/2019 | Bao | ......................... | H10D 84/85 |
| 2020/0091348 A1* | 3/2020 | Guha | ................. | H10D 30/6744 |
| 2021/0399104 A1* | 12/2021 | Chang | ................... | H10D 30/62 |
| 2022/0059533 A1* | 2/2022 | Bae | ......................... | H10D 30/43 |

* cited by examiner

*Primary Examiner* — Tong-Ho Kim
(74) *Attorney, Agent, or Firm* — Schwabe, Williamson & Wyatt P.C.

(57) ABSTRACT

Gate-all-around integrated circuit structures having common metal gates and having gate dielectrics with differentiated dipole layers are described. For example, an integrated circuit structure includes a first vertical arrangement of horizontal nanowires, and a second vertical arrangement of horizontal nanowires. A P-type gate stack is over the first vertical arrangement of horizontal nanowires, the P-type gate stack having a mid-gap to P-type conductive layer over a first gate dielectric including a high-k dielectric layer and a first dipole material layer. An N-type gate stack is over the second vertical arrangement of horizontal nanowires, the N-type gate stack having the mid-gap to P-type conductive layer over a second gate dielectric including the high-k dielectric layer and a second dipole material layer, the second dipole layer different than the first dipole material layer.

20 Claims, 14 Drawing Sheets

1

FABRICATION OF GATE-ALL-AROUND INTEGRATED CIRCUIT STRUCTURES HAVING COMMON METAL GATES AND HAVING GATE DIELECTRICS WITH DIFFERENTIATED DIPOLE LAYERS

TECHNICAL FIELD

Embodiments of the disclosure are in the field of integrated circuit structures and processing and, in particular, gate-all-around integrated circuit structures having common metal gates and having gate dielectrics with differentiated dipole layers.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In another aspect, maintaining mobility improvement and short channel control as microelectronic device dimensions scale below the 10 nanometer (nm) node provides a challenge in device fabrication. Nanowires used to fabricate devices provide improved short channel control.

Scaling multi-gate and nanowire transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features.

2 structure having common metal gates, in accordance with an embodiment of the present disclosure.

Figure 3:
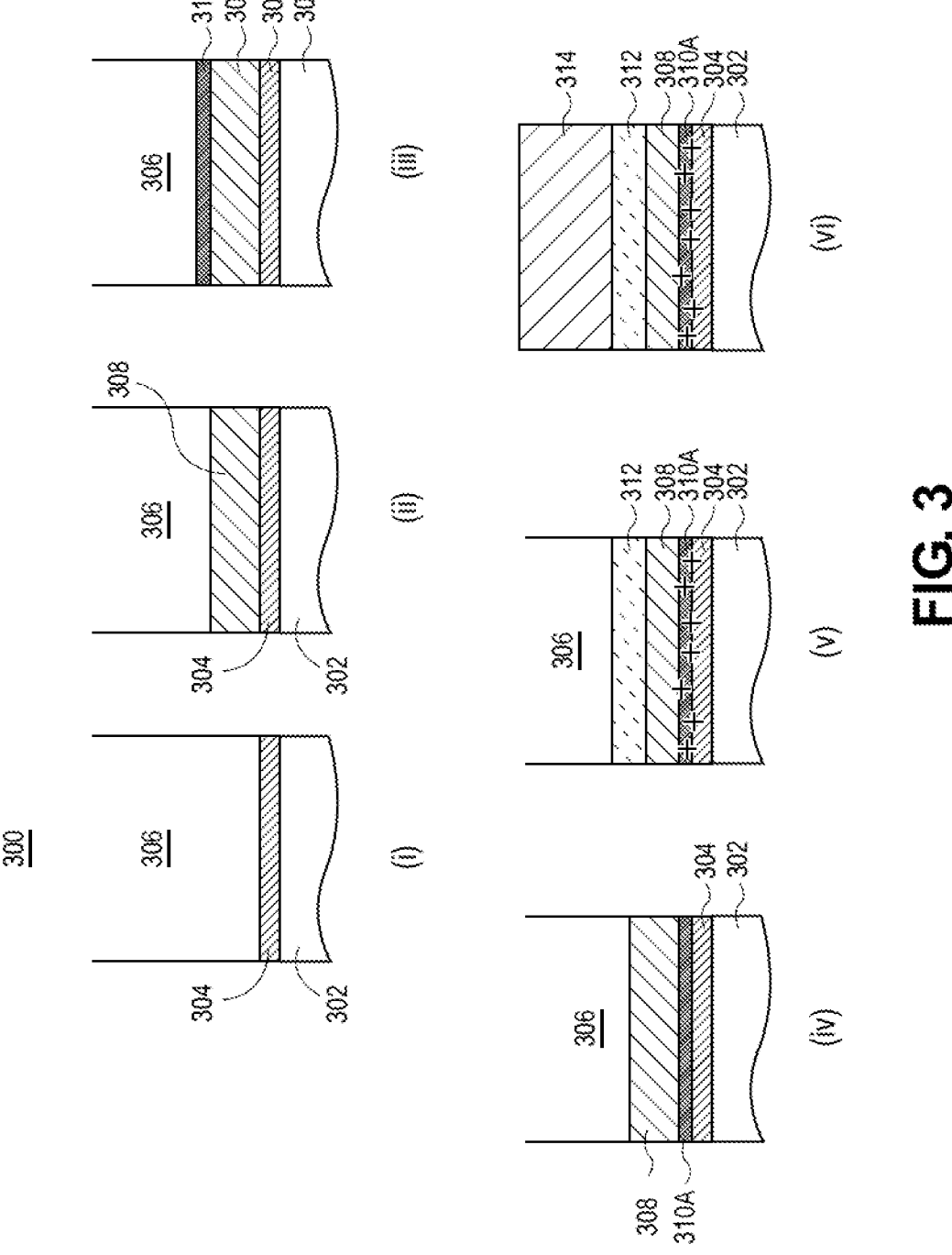

FIG. 3 illustrates cross-sectional views in a gate stack representing various operations in a method of fabricating an integrated circuit structure having a dipole layer used to tune the threshold voltage of the gate stack, in accordance with an embodiment of the present disclosure.

FIGS. 4A-4J illustrates cross-sectional views of various operations in a method of fabricating a gate-all-around integrated circuit structure, in accordance with an embodiment of the present disclosure.

Figure 5:
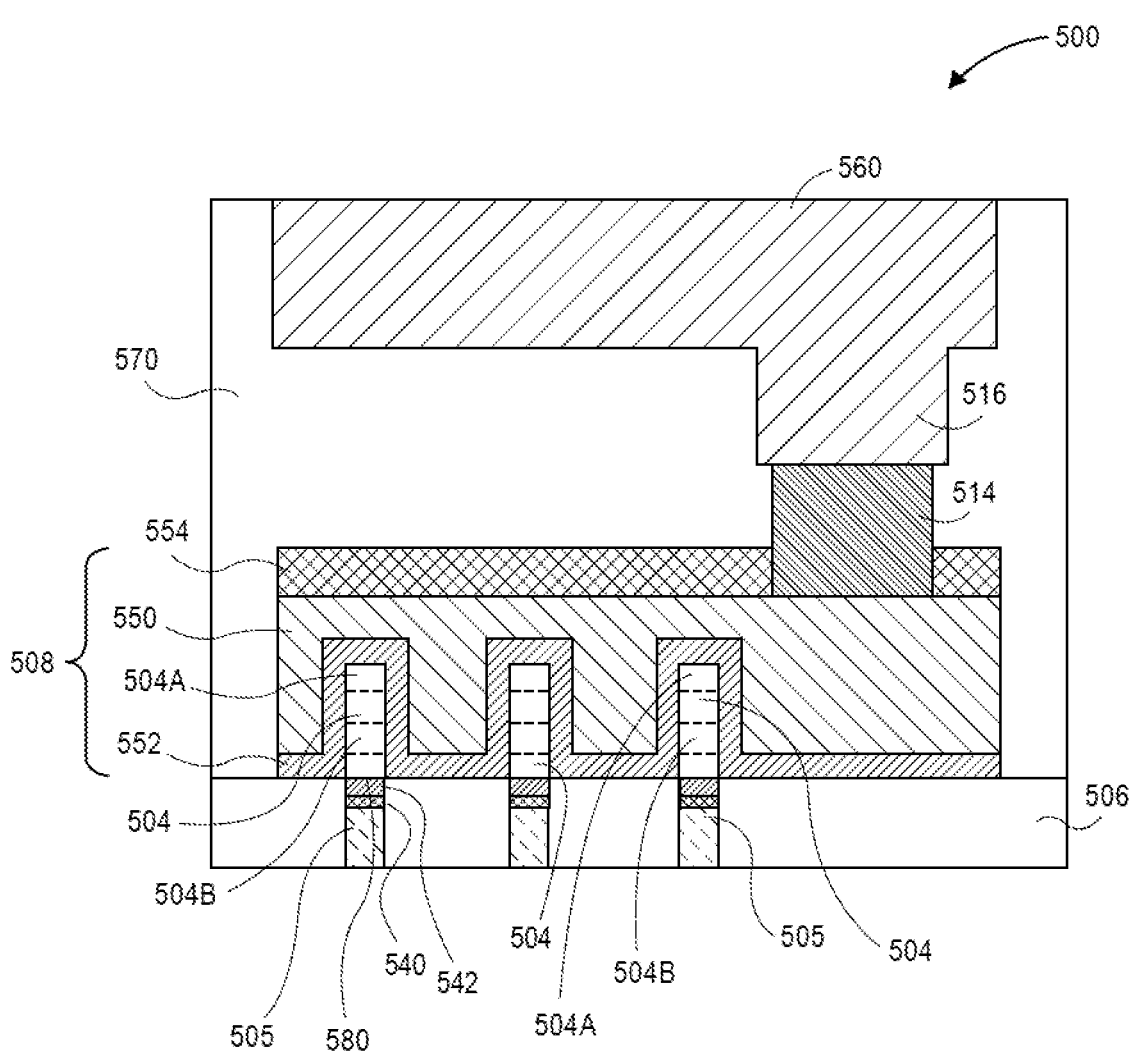

FIG. 5 illustrates a cross-sectional view of a non-planar integrated circuit structure as taken along a gate line, in accordance with an embodiment of the present disclosure.

Figure 6:
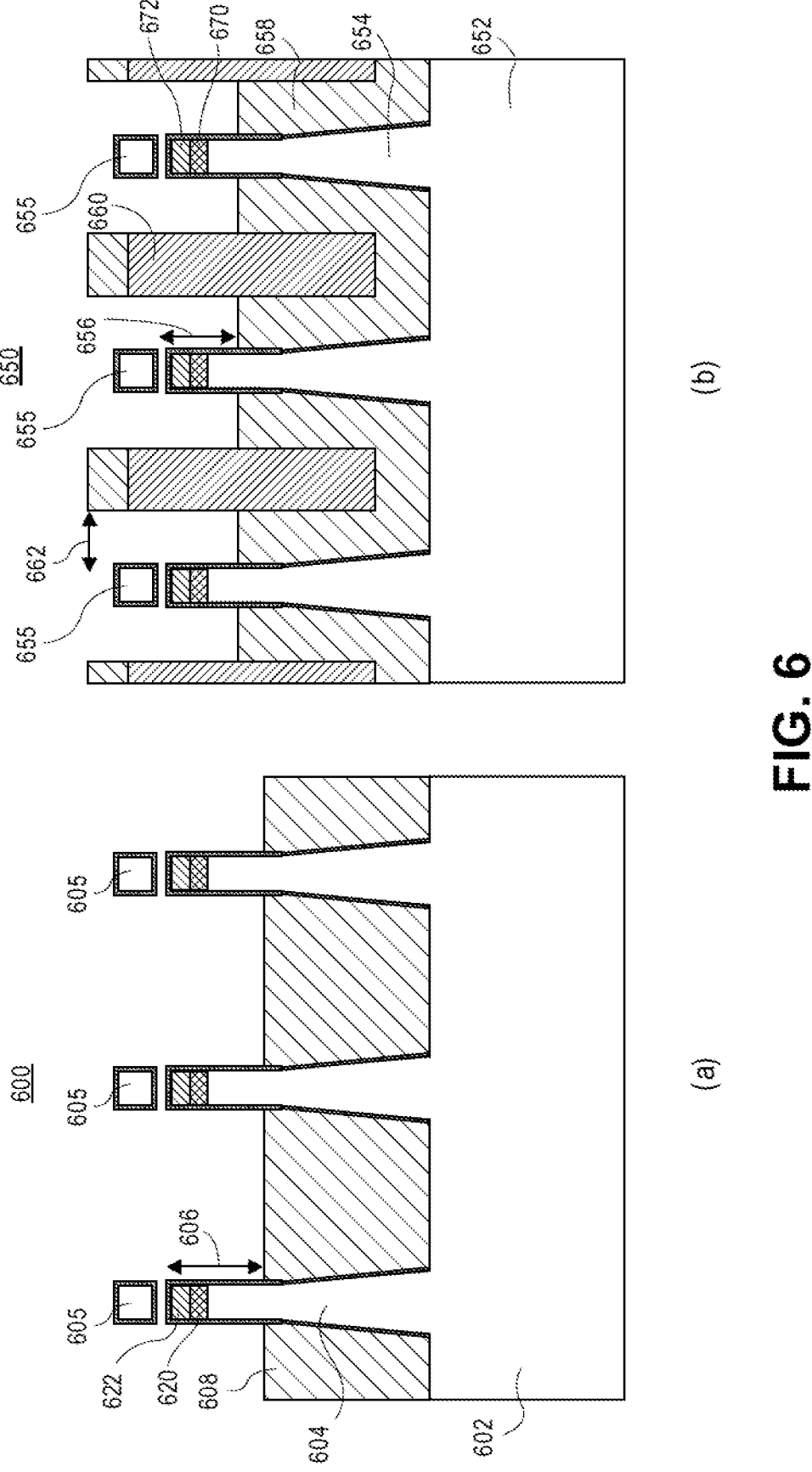

FIG. 6 illustrates cross-sectional views taken through nanowires and fins for a non-endcap architecture (left-hand side (a)) versus a self-aligned gate endcap (SAGE) architecture (right-hand side (b)), in accordance with an embodiment of the present disclosure.

Figure 7:
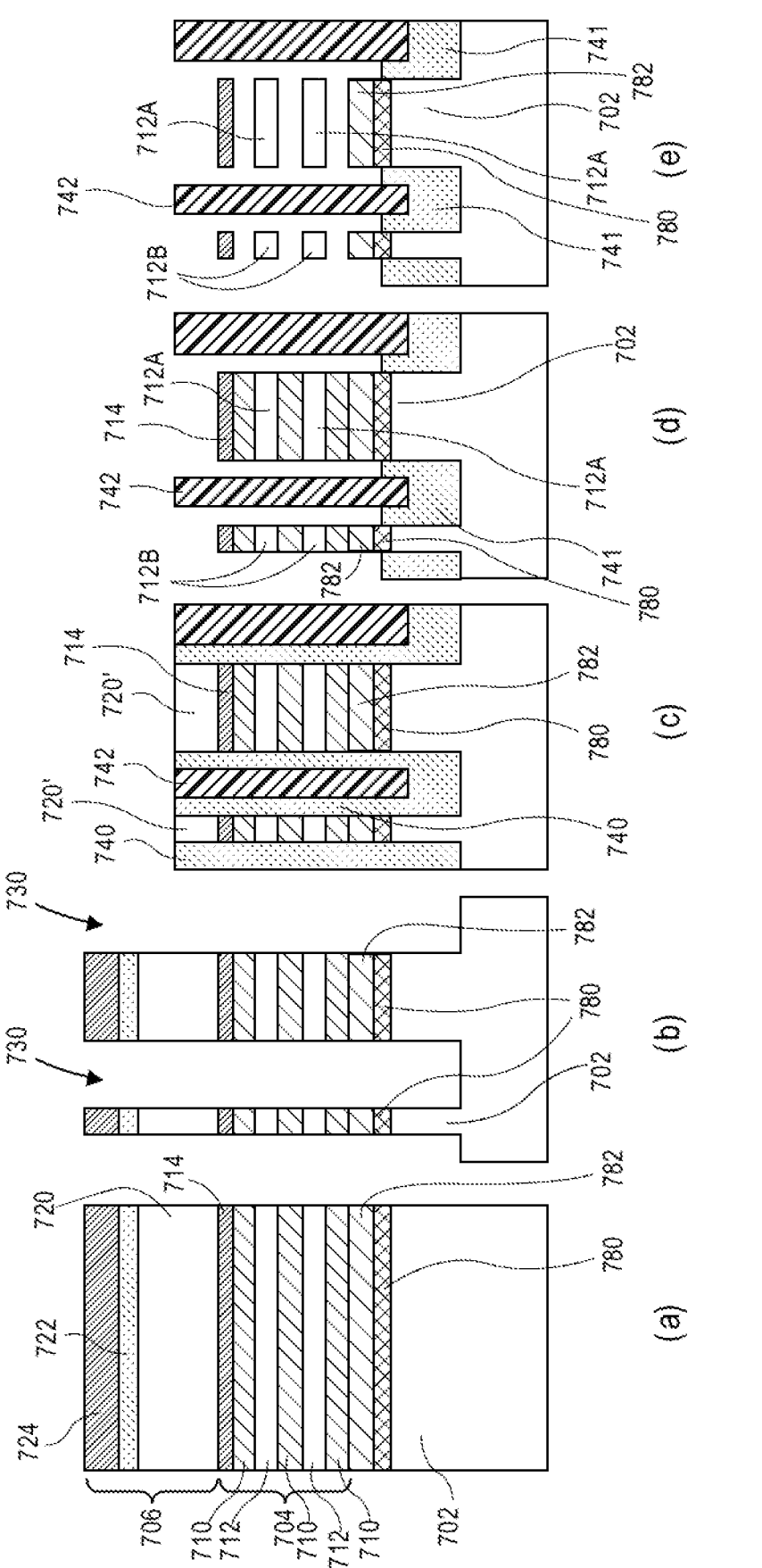

FIG. 7 illustrates cross-sectional views representing various operations in a method of fabricating a self-aligned gate endcap (SAGE) structure with gate-all-around devices, in accordance with an embodiment of the present disclosure.

Figures 8A, 8B, 8C:
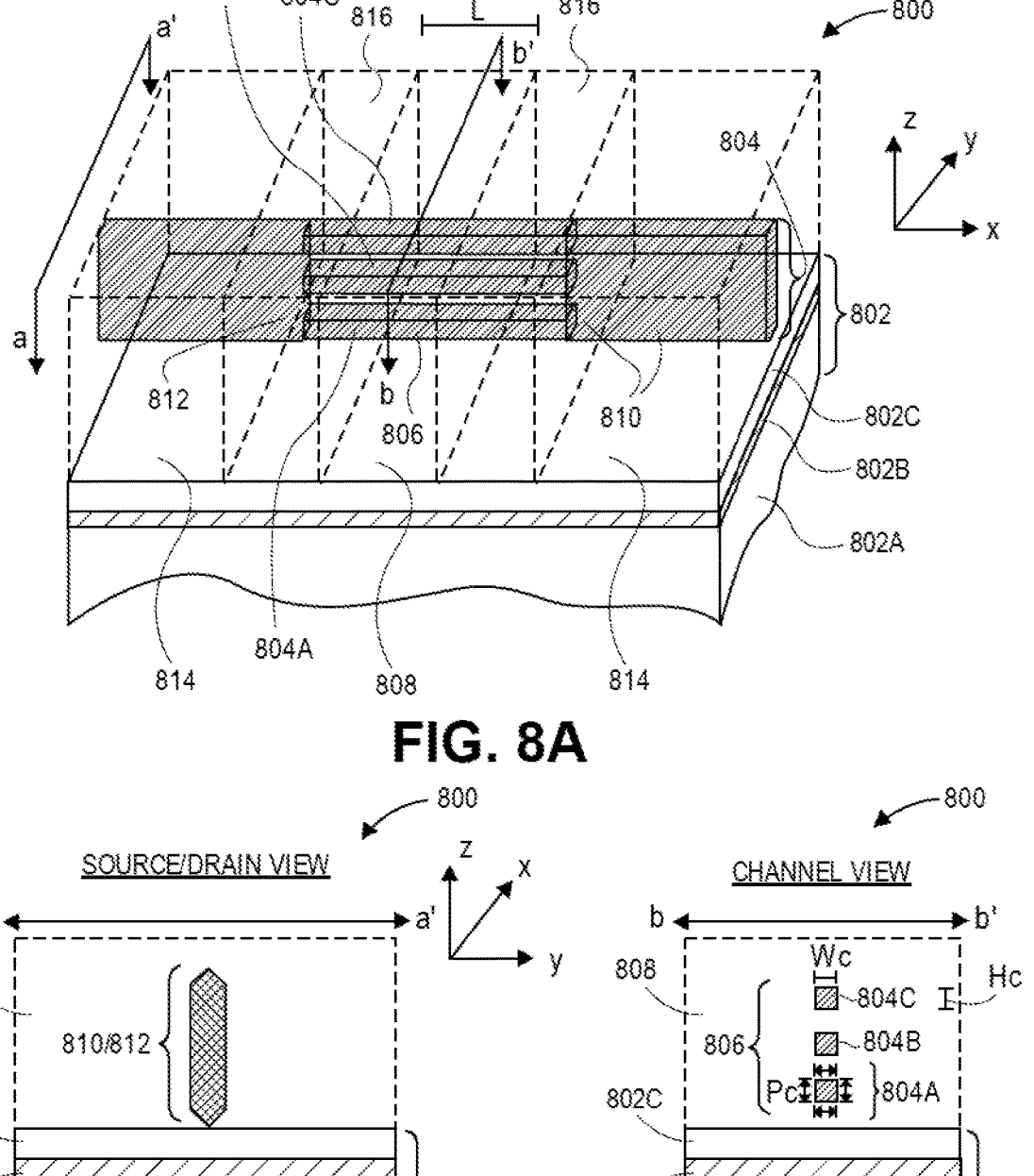

FIG. 8A illustrates a three-dimensional cross-sectional view of a nanowire-based integrated circuit structure, in accordance with an embodiment of the present disclosure.

FIG. 8B illustrates a cross-sectional source or drain view of the nanowire-based integrated circuit structure of FIG. 8A, as taken along the a-a' axis, in accordance with an embodiment of the present disclosure.

FIG. 8C illustrates a cross-sectional channel view of the nanowire-based integrated circuit structure of FIG. 8A, as taken along the b-b' axis, in accordance with an embodiment of the present disclosure.

Figure 9:
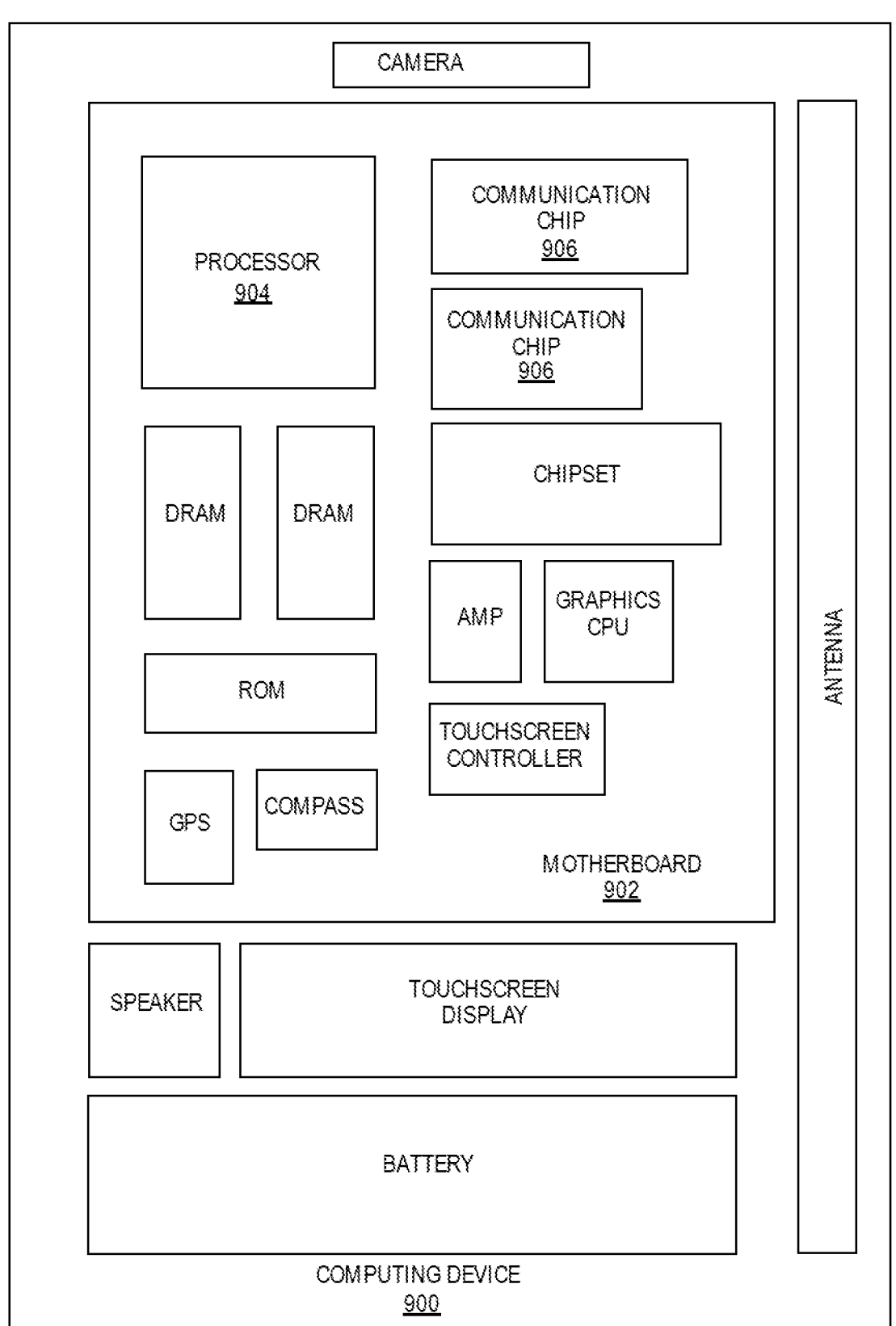

FIG. 9 illustrates a computing device in accordance with one implementation of an embodiment of the disclosure.

Figure 10:
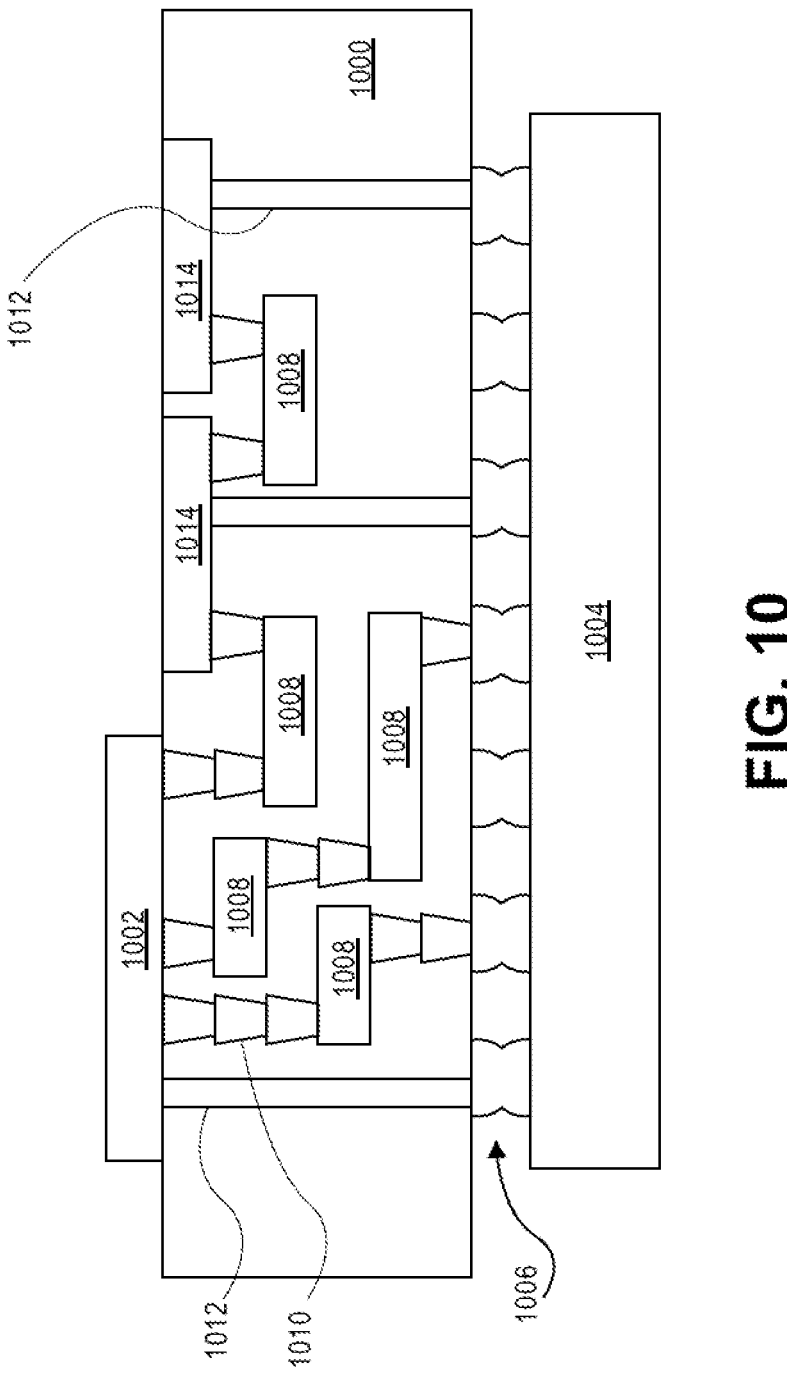

FIG. 10 illustrates an interposer that includes one or more embodiments of the disclosure.

DESCRIPTION OF THE EMBODIMENTS

Gate-all-around integrated circuit structures having common metal gates and having gate dielectrics with differentiated dipole layers are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back-end-of-line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to gate-all-around one mid-gap metal gate stack using dual polarity dipoles. One or more embodiments described herein are directed to gate-all-around devices fabricated using a common metal gate flow. One or more embodiments described herein are directed to gate-all-around dipole multi-VT metal gate patterning. Particular embodiments are directed to gate-all-around metal gate pattering using only dipole subtractive flow masks and only one work function metal. It is to be appreciated that, unless indicated otherwise, reference to nanowires can indicate nanowires or nanoribbons, or even nanosheets.

It is to be appreciated that modern CMOS technologies require multiple VT (Multi-VT) device flavors in both NMOS and PMOS. However, the Multi-VT requirement can render the overall metal gate (MG) flow longer, more complicated and more expensive because of the increased number of masks and processing operations. Embodiments described herein may be implemented to address such issues.

To provide context, dual metal gate (DMG) using a subtractive metal gate (SMG) flow has been the semiconductor industry's approach since Intel's pioneering 45 nm HiK Metal Gate process. In a standard DMG SMG flow, a work function metal (WFM) thin film is first deposited on an entire wafer, subsequently patterned using a hard mask (HM), and then removed/subtracted in OPEN patterned areas using an isotropic wet etch. While DMG SMG works very well for planar and FinFET transistors, it nonetheless can break down for a Gate-all-around (GAA) architecture. The GAA unique architecture renders the isotropic wet etch bias (WEB) of the subtracted/removed metal too large for ensuring minimum N-P boundary conditions. In GAA, the WFM layer can merge in between the nano-ribbons (NR).

Etching the merged metal can require using very aggressive wet chemistries and/or long etch times. The result inadvertently creates a very large creep/undercut under the hardmask (HM) which fails to protect the WFM in the BLOCK area any longer. The large isotropic WEB in the BLOCK region can render in turn the N-P boundary as very wide which can adversely affect the ability to deliver high transistor density for GAA architecture.

To provide further context, a dual metal stack can be difficult to integrate with a Metal Gate Cut (MGC) scheme while delivering tight poly end caps, e.g., <10 nm since MGC has different etch rates in different N-WFN and P-WFM materials. Additionally, a larger N-P boundary due to presence of a N-type workfunction metal (N-WFM) wall in an additive metal gate flow can limit library cell height.

In accordance with one or more embodiments of the present disclosure, addressing issues outlined above, approaches are described for implementing a common metal gate rather than a dual metal gate DMG using subtractive metal gate (SMG) flow approach. For GAA, the common metal gate flow avoids the difficult isotropic wet etch removal of merged WFM in between NR and its associated large WEB issues that are part of standard DMG SMG flow. In an embodiment, a common metal gate approach enables tight N-P boundary and high transistor density for GAA architectures.

To provide further context, dipoles can be used to set the threshold voltage and to enable relative thinning of workfunction metal layers. Embodiments may be implemented to set a threshold voltage (VT) by using a thin layer of dipole, thereby replacing thicker workfunction metals used in state-of-the-art scaled devices. Embodiments may provide a multi-VT solution and also provide ultra-low VT with a relatively thinner workfunction metal.

In previous approaches, a one-gate/mask patterning processing scheme is using a standard subtractive metal gate flow (SMGF) to fabricate a six voltage threshold (6VT) structure such as a 3VTP and 3VTN (3P3N) structure with a minimum of five masks where each mask patterns a single gate type. However, using one mask for patterning each gate type can render the multi-VT process longer, more complicated and overall more costly. Additionally, multiple masks/operations can expose gate materials such as high-k (HiK) materials and/or gate spacer materials to multiple dry/wet etch patterning chemistries that can weaken their structural integrity and decreases the overall reliability of the device. Other approaches may include additive workfunction metal flows having a signature wall at the N-P boundary which may inadvertently increase the tightest possible N-P boundary by the amount of the workfunction metal (WFM) thickness which may render the N-P boundary non-optimal.

In an embodiment, a mid-gap metal gate stack as described herein has a work-function between (but not including) about 4 eV (NMOS) and about 5 eV (PMOS). In one embodiment, a purely mid-gap metal gate stack has a work-function of about 4.5 eV. In one embodiment, a slightly-P mid-gap metal gate stack has a work-function between (but not including) about 4.5 eV (mid-gap) and about 5 eV (PMOS), with a particular embodiment between (but not including) about 4.5 eV (mid-gap) and 4.7 eV. In one embodiment, a slightly-N mid-gap metal gate stack has a work-function between (but not including) about 4.5 eV (mid-gap) and about 4 eV (NMOS), with a particular embodiment between (but not including) about 4.5 eV (mid-gap) and 4.3 eV.

In accordance with one or more embodiments of the present disclosure, addressing issues outlined above, approaches can include use of an additive selective metal gate patterning in which a blanket seed liner is deposited on a wafer followed by a carbon based hardmask patterning that stops on the blanket seed liner. In an embodiment, with reference to FIG. 1A, described below, an approach uses only one slightly-P mid-gap metal gate stack (P/MG-WFM+ Fill Metal) and dual polarity dipoles (N-Type for Polarity Flipping and N-VT Tuning and P-Type for P-VT Tuning). In one embodiment, a reduced 350-400 mV polarity flipping between P-HVT and N-HVT as a result of using P/MG-WFM is achieved through a series of process optimizations including N-Type dipole thickness, dipole deposition conditions and dipole drive-in anneals. Embodiments described herein can be implemented to deliver a relatively milder dipole polarity flipping requirement, one metal stack suitable for MGC and the tightest N-P boundary for smallest Library Cell Height (increased transistor density).

The detection of the implementation of embodiments described herein can include the revealing of both NMOS and PMOS sharing the same Mid-Gap+CVD W Metal Gate Stack, as detected by TEM EDX/EELS. The detection of the implementation of embodiments described herein can include the revealing of NMOS having N-type dipoles whereas PMOS has P-type Dipole, as detected by TEM, SIMS, APT. The detection of the implementation of embodiments described herein can include the revealing of dipole flipping type (N- or P-type) as opposite polarity with the Mid-Gap Work Function Metal (slightly P- or N-type), as detected by TEM EDX/EELS, APT. The detection of the implementation of embodiments described herein can include the revealing of the strength/concentration of polarity flipping dipole is 3-4× that of VT tuning dipole, as detected by TEM EELS, APT, TOFSIMS. The detection of the implementation of embodiments described herein can include the revealing of multi-VT obtained by using different dipole concentrations, such as described in association with FIGS. 1A and 1B.

Figure 1A:
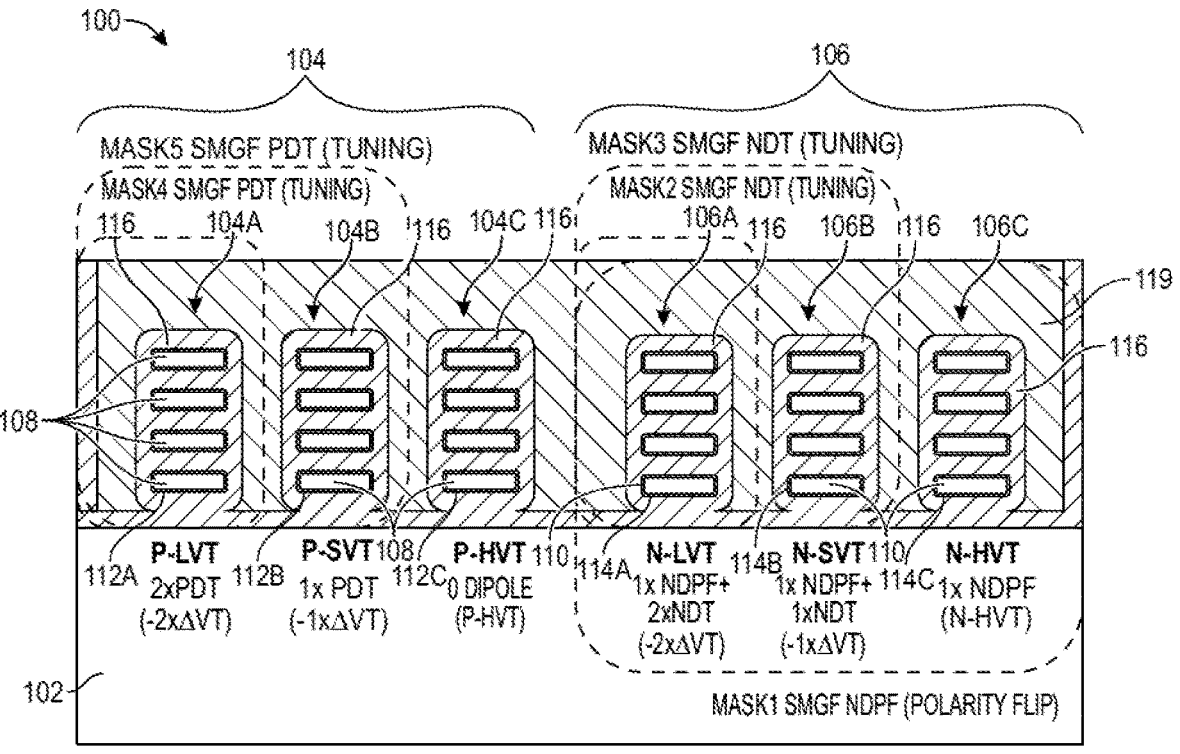
FIG. 1A illustrates a cross-sectional view of a gate-all-around integrated circuit structure having common metal gates and having gate dielectrics with differentiated dipole layers, in accordance with an embodiment of the present disclosure.

In an embodiment, for a mid-gap to P-type work-function metal (P/MG-WFM), e.g., for FIG. 1A, ALD Mo or ALD TiN slightly doped with Al can be used. The N-dipole can be only La or only Mg or a combination of both (Mg for PF, La for Tuning), and can be extended to other N-dipoles such as Y, Ba, Sr. The P-dipole can be Al or Ti and can be extended to Nb, Ga. In another embodiment, for a mid-gap to N-type work-function metal (N/MG-WFM), e.g., for FIG. 1B, ALD TiAlC (low Al %) can be used. The P-dipole can be Al or only Ti or a combination of both, and can be extended to other P-dipoles such as Nb, Ga. The N-dipole can be La or Mg, and can be extended to Y, Ba, Sr. In an embodiment, a gate fill metal is CVD W, but can be extended to ALD/CVD Mo for low Gate Resistance. In an embodiment, the schemes of FIG. 1A or 1B can be extended to 4P4N or 5P5N by adding more dipole masks. In an embodiment, the schemes of FIG. 1A or 1B can be used in conjunction with non-selective and selective metal gate cuts. In an embodiment, the schemes of FIG. 1A or 1B can be applied to FinFET architectures.

In a first example, FIG. 1A illustrates a cross-sectional view of a gate-all-around integrated circuit structure having common metal gates and having gate dielectrics with differentiated dipole layers, in accordance with an embodiment of the present disclosure.

Referring to FIG. 1A, an integrated circuit structure 100 includes a P-type region 104 and an N-type region 106 over a substrate 102.

The P-type region 104 includes a low-VT P-type device (P-LVT) 104A, a standard-VT P-type device (P-SVT) 104B, and a high-VT P-type device (P-HVT) 104C. The devices 104A, 104B and 104C each include a plurality of horizontal nanowires or nanoribbons 108 surrounded by a corresponding gate dielectric 112A, 112B or 112C, respectively. Gate dielectric 112C does not include a dipole layer, gate dielectric 112B includes a single delta VT (−1×ΔVT) P-type dipole tuning layer (1×PDT), and gate dielectric 112A includes a double delta VT (−2×ΔVT) P-type dipole tuning layer (2×PDT). A mid-gap to P-type conductive layer 116 (P/MG-WFM) surrounds the nanowires 108.

The N-type region 106 includes a low-VT N-type device (N-LVT) 106A, a standard-VT N-type device (N-SVT) 106B, and a high-VT N-type device (N-HVT) 106C. The devices 106A, 106B and 106C each include a plurality of horizontal nanowires or nanoribbons 110 surrounded by a corresponding gate dielectric 114A, 114B or 114C, respectively. Gate dielectric 114C includes an N-type dipole polarity flipping layer (1×NDPF), gate dielectric 114B includes the N-type dipole polarity flipping layer (1×NDPF) and a single delta VT (−1×ΔVT) N-type dipole tuning layer (1×NDT), and gate dielectric 114A includes the N-type dipole polarity flipping layer (1×NDPF) and a double delta VT (−2×ΔVT) N-type dipole tuning layer (2×NDT). The mid-gap to P-type conductive layer 116 (P/MG-WFM) surrounds the nanowires 110. In an embodiment, the mid-gap to P-type conductive layer 116 (P/MG-WFM) is continuous between the P-type region 104 and the N-type region 106, as is depicted. In an embodiment, a conductive fill 119 is over the mid-gap to P-type conductive layer 116, as is depicted.

In an embodiment, integrated circuit structure 100 is fabricated using a first mask (Mask 1) for performing a subtractive metal gate flow (SMGF), applied to NDPF. A second mask (Mask 2) is for performing a subtractive metal gate flow (SMGF), applied to NDT. A third mask (Mask 3) is for performing a subtractive metal gate flow (SMGF), also applied to NDT. A fourth mask (Mask 4) is for performing a subtractive metal gate flow (SMGF), applied to PDT. A fifth mask (Mask 5) is for performing a subtractive metal gate flow (SMGF), also applied to PDT.

With reference again to FIG. 1A, in accordance with an embodiment of the present disclosure, an integrated circuit structure 100 includes a first vertical arrangement of horizontal nanowires 108, and a second vertical arrangement of horizontal nanowires 110. A P-type gate stack is over the first vertical arrangement of horizontal nanowires 108. The P-type gate stack has a mid-gap to P-type conductive layer 116 over a first gate dielectric 112A, 112B or 112C including a high-k dielectric layer and a first dipole material layer. An N-type gate stack is over the second vertical arrangement of horizontal nanowires 110. The N-type gate stack has the mid-gap to P-type conductive layer 116 over a second gate dielectric 114A, 114B or 114C including the high-k dielectric layer and a second dipole material layer, the second dipole layer different than the first dipole material layer.

In an embodiment, the high-k dielectric layer includes hafnium and oxygen. In an embodiment, the first dipole material layer includes an oxide of Al, Ti, Nb or Ga, and the second dipole material layer includes an oxide of La, Mg, Y, Ba or Sr. In an embodiment, the first dipole material layer or the second dipole material layer has a thickness in the range of 1-3 Angstroms. In an embodiment, the first dipole material layer or the second dipole material layer has a thickness in the range of 4-6 Angstroms. In an embodiment, the mid-gap to P-type conductive layer 116 is continuous between the first vertical arrangement of horizontal nanowires 108 and the second vertical arrangement of horizontal nanowires 110, as is depicted.

In an embodiment, the integrated circuit structure 100 further includes corresponding pairs of epitaxial source or drain structures at first and second ends of each of the vertical arrangement of horizontal nanowires 108 or 110, as would be viewable into or out of the page, and examples of which are described in greater detail below. In one embodiment, one or more conductive contact structures is on a corresponding one or more epitaxial source or drain structures, examples of which are described in greater detail below. In one embodiment, the pairs of epitaxial source or drain structures are pairs of non-discrete epitaxial source or drain structures, examples of which are described in greater detail below. In one embodiment, the pairs of epitaxial source or drain structures are pairs of discrete epitaxial source or drain structures, examples of which are described in greater detail below.

Figure 1B:
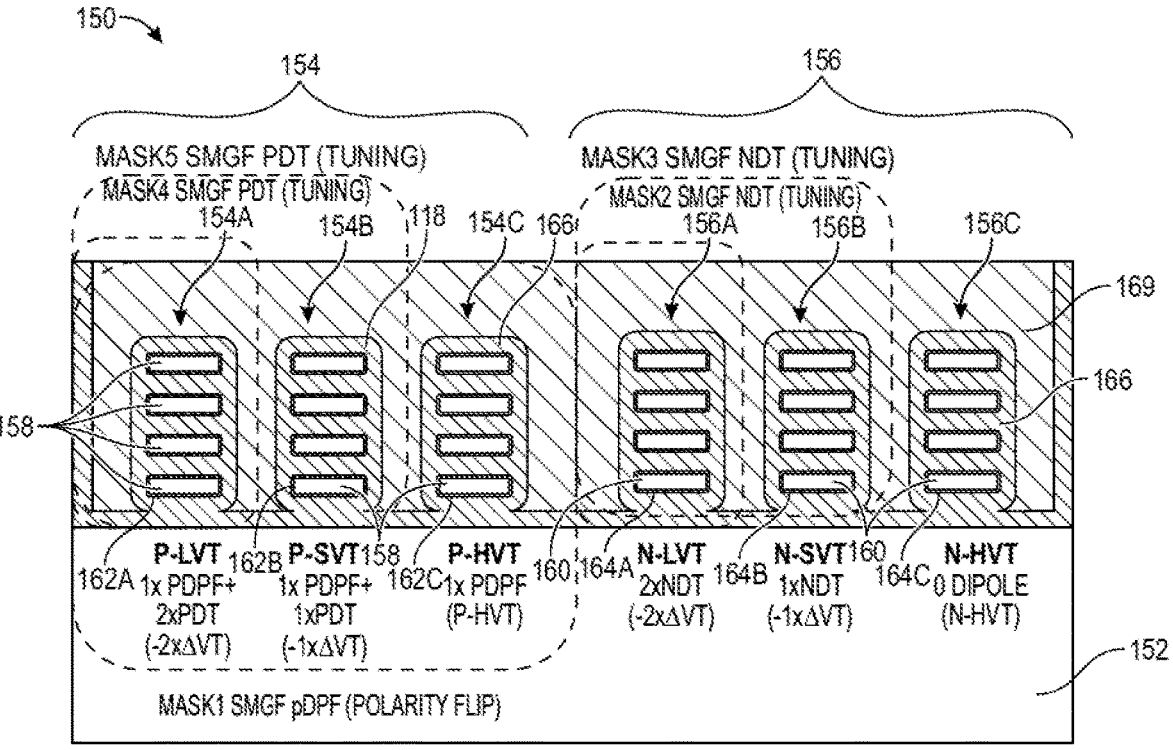
FIG. 1B illustrates a cross-sectional view of a gate-all-around integrated circuit structure having common metal gates and having gate dielectrics with differentiated dipole layers, in accordance with an embodiment of the present disclosure.

In a second example, FIG. 1B illustrates a cross-sectional view of a gate-all-around integrated circuit structure having common metal gates and having gate dielectrics with differentiated dipole layers, in accordance with an embodiment of the present disclosure.

Referring to FIG. 1B, an integrated circuit structure 150 includes a P-type region 154 and an N-type region 156 over a substrate 152.

The P-type region 154 includes a low-VT P-type device (P-LVT) 154A, a standard-VT P-type device (P-SVT) 154B, and a high-VT P-type device (P-HVT) 154C. The devices 154A, 154B and 154C each include a plurality of horizontal nanowires or nanoribbons 158 surrounded by a corresponding gate dielectric 162A, 162B or 162C, respectively. Gate dielectric 162C includes a P-type dipole polarity flipping layer (1×PDPF), gate dielectric 162B includes the P-type dipole polarity flipping layer (1×PDPF) and a single delta VT (−1×ΔVT) P-type dipole tuning layer (1×PDT), and gate dielectric 162A includes the P-type dipole polarity flipping layer (1×PDPF) and a double delta VT (−2×ΔVT) P-type dipole tuning layer (2×PDT). A mid-gap to N-type conductive layer 166 (N/MG-WFM) surrounds the nanowires 158.

The N-type region 156 includes a low-VT N-type device (N-LVT) 156A, a standard-VT N-type device (N-SVT) 156B, and a high-VT N-type device (N-HVT) 156C. The devices 156A, 156B and 156C each include a plurality of horizontal nanowires or nanoribbons 160 surrounded by a corresponding gate dielectric 164A, 164B or 164C, respectively. Gate dielectric 164C includes no dipole layer, gate dielectric 164B includes a single delta VT (−1×ΔVT) N-type dipole tuning layer (1×NDT), and gate dielectric 164A includes a double delta VT (−2×ΔVT) N-type dipole tuning layer (2×NDT). The mid-gap to N-type conductive layer 166 (N/MG-WFM) surrounds the nanowires 160. In an embodiment, the mid-gap to N-type conductive layer 166 (N/MG-WFM) is continuous between the P-type region 154 and the N-type region 156, as is depicted. In an embodiment, a conductive fill 169 is over the mid-gap to N-type conductive layer 166, as is depicted.

In an embodiment, integrated circuit structure 150 is fabricated using a first mask (Mask 1) for performing a subtractive metal gate flow (SMGF), applied to PDPF. A second mask (Mask 2) is for performing a subtractive metal gate flow (SMGF), applied to NDT. A third mask (Mask 3) is for performing a subtractive metal gate flow (SMGF), also applied to NDT. A fourth mask (Mask 4) is for performing a subtractive metal gate flow (SMGF), applied to PDT. A fifth mask (Mask 5) is for performing a subtractive metal gate flow (SMGF), also applied to PDT.

With reference again to FIG. 1B, in accordance with an embodiment of the present disclosure, an integrated circuit structure 150 includes a first vertical arrangement of horizontal nanowires 158, and a second vertical arrangement of horizontal nanowires 160. A P-type gate stack is over the first vertical arrangement of horizontal nanowires 158. The P-type gate stack has a mid-gap to N-type conductive layer 166 over a first gate dielectric 162A, 162B or 162C including a high-k dielectric layer and a first dipole material layer. An N-type gate stack is over the second vertical arrangement of horizontal nanowires 160. The N-type gate stack has the mid-gap to N-type conductive layer 166 over a second gate dielectric 164A, 164B or 164C including the high-k dielectric layer and a second dipole material layer, the second dipole layer different than the first dipole material layer.

In an embodiment, the high-k dielectric layer includes hafnium and oxygen. In an embodiment, the first dipole material layer includes an oxide of Al, Ti, Nb or Ga, and the second dipole material layer includes an oxide of La, Mg, Y, Ba or Sr. In an embodiment, the first dipole material layer or the second dipole material layer has a thickness in the range of 1-3 Angstroms. In an embodiment, the first dipole material layer or the second dipole material layer has a thickness in the range of 4-6 Angstroms. In an embodiment, the mid-gap to N-type conductive layer 166 is continuous between the first vertical arrangement of horizontal nanowires 158 and the second vertical arrangement of horizontal nanowires 160, as is depicted.

In an embodiment, the integrated circuit structure 150 further includes corresponding pairs of epitaxial source or drain structures at first and second ends of each of the vertical arrangement of horizontal nanowires 158 or 160, as would be viewable into or out of the page, and examples of which are described in greater detail below. In one embodiment, one or more conductive contact structures is on a corresponding one or more epitaxial source or drain structures, examples of which are described in greater detail below. In one embodiment, the pairs of epitaxial source or drain structures are pairs of non-discrete epitaxial source or drain structures, examples of which are described in greater detail below. In one embodiment, the pairs of epitaxial source or drain structures are pairs of discrete epitaxial source or drain structures, examples of which are described in greater detail below.

It is to be appreciated that for a 3P3N patterning scheme used to fabricate the structures of FIGS. 1A and 1B, embodiments may be implemented to avoid large N-P boundaries associated with etching a workfunction metal (WFM) in between nano-ribbons and may avoid adding to a WFM wall thickness at the N-P boundary. Thus, embodiment scan be implemented to enable the tightest possible N-P boundary design for the highest GAA transistor density. By using a reduced number of masks to generate a 3P3N gate all around multi-VT device, implementation of embodiments described herein can reduce flow complexity, the number of process operations, and metal gate (MG) loops costs. Also, the overall number of patterning and etch operations that otherwise attack the gate materials can be reduced and ultimately increase the general reliability of the fabricated devices.

In an embodiment, a common metal gate process flow is used as a final operation of a metal gate after multi-VT patterning process has been completed. A common metal gate process may be used either for a mid-gap to N-type workfunction metal (N/MG-WFM, e.g., FIG. 1B) or mid-gap to P-type workfunction metal (P/MG-WFM, e.g., FIG. 1A). After common metal gate processing is complete, the gate stack may be subsequently blanket deposited with a gate fill metal.

Figure 2:
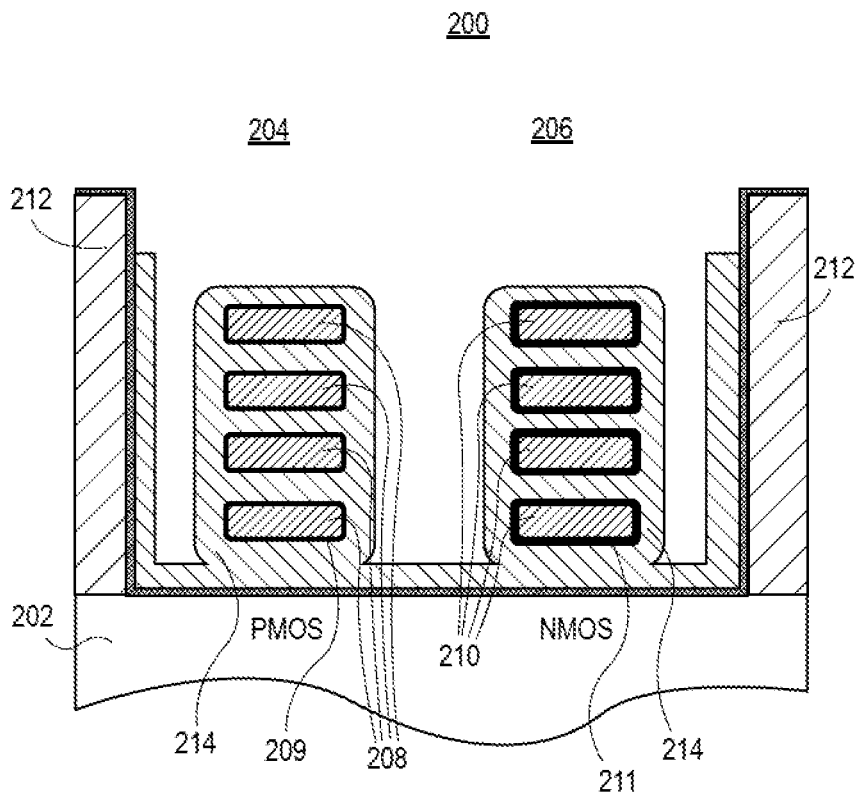
FIG. 2 illustrates a cross-sectional view of an operation in a method of fabricating a gate-all-around integrated circuit

As an exemplary intermediate structure in a common metal gate process flow, FIG. 2 illustrates a cross-sectional view of an operation in a method of fabricating a gate-all-around integrated circuit structure having common metal gates, in accordance with an embodiment of the present disclosure.

Referring to FIG. 2, a method of fabricating an integrated circuit structure includes a starting structure 200 including a PMOS region 204 and an NMOS region 206 above a substrate 202. The PMOS region 204 includes a first plurality of horizontal nanowires 208 (which can be nanoribbons). The NMOS region 206 includes a second plurality of horizontal nanowires 210 (which can be nanoribbons). A first gate dielectric 209 surrounds nanowires of the first plurality of horizontal nanowires 208. A second gate dielectric layer 211 that also contains an N-type dipole flipping layer surrounds nanowires of the second plurality of horizontal nanowires 210. The PMOS region 204 and the NMOS region 206 are included in a trench in a dielectric layer 212. A mid-gap to P-type conductive layer 214 is in both the PMOS region 204 and the NMOS region 206. The mid-gap to P-type conductive layer 214 surrounds the nanowires of the first plurality of horizontal nanowires 208, and also surrounds the nanowires of the second plurality of horizontal nanowires 210. Although not depicted, a conductive fill can then be formed over the structure of FIG. 2. It is to be appreciated that the PMOS (or P-type) and NMOS (or N-type) designated features may be reversed as NMOS (or N-type) and PMOS (or P-type) designated features, respectively.

In another exemplary fabrication scheme, FIG. 3 illustrates cross-sectional views in a gate stack representing various operations in a method of fabricating an integrated circuit structure having a dipole layer used to tune the threshold voltage of the gate stack, in accordance with an embodiment of the present disclosure.

Referring to part (i) of FIG. 3, a method of fabricating an integrated circuit structure includes forming a starting structure 300 including an amorphous oxide layer 304, such as an $SiO_2$ layer, on a semiconductor channel structure 302. A trench 306, such as a trench formed during a replacement gate scheme exposes the amorphous oxide layer 304.

Referring to part (ii) of FIG. 3, a high-k dielectric layer 308 is formed in the trench 306 and on the amorphous oxide layer 304.

Referring to part (iii) of FIG. 3, a material layer 310 is formed in the trench 306 and on the high-k dielectric layer 308.

Referring to part (iv) of FIG. 3, the material layer 310 and the high-k dielectric layer 308 are annealed to form a gate dielectric over the semiconductor channel structure 302. The gate dielectric includes the high-k dielectric layer 308 on a dipole material layer 310A. The dipole material layer 310A is distinct from the high-k dielectric layer 308.

Referring to part (v) of FIG. 3, a workfunction layer 312 is formed in the trench 306 and on the high-k dielectric layer 308. The workfunction layer 312 includes a metal.

Referring to part (vi) of FIG. 3, a gate stack is formed by forming a gate stressor layer 314 on the workfunction layer 312.

With reference again to FIG. 3, in accordance with an embodiment of the present disclosure, a high-k metal gate process is initiated after spacer formation and epitaxial deposition in front end flow. In the metal gate loop, a layer of chemical oxide 304 is formed during wet cleans. The layer can also or instead be thermally grown to improve the interface quality. A layer of high-k oxide 308 with higher dielectric constant is then deposited on the underlying chemical oxide layer 304. A dipole layer 310 is then deposited by an atomic layer deposition technique. The gate stack is then subjected to high anneal temperature during which the dipole 310 diffuses through the underlying high permittivity oxide layer 308 to form a net dipole 310A at the high-k 308/chemical oxide 304 interface. The process is understood as being effected due to the difference in the electronegativities of high-k and the chemical oxide layer. Subsequently, workfunction metals 312 are deposited, followed by a gate stressor 314 to increase channel stress.

With reference again to part (vi) of FIG. 3, in accordance with an embodiment of the present disclosure, an integrated circuit structure includes a semiconductor channel structure 302 including a monocrystalline material. A gate dielectric is over the semiconductor channel structure 302. The gate dielectric includes a high-k dielectric layer 308 on a dipole material layer 310A. The dipole material layer 310A is distinct from the high-k dielectric layer 308. A gate electrode has a workfunction layer 312 on the high-k dielectric layer 308. The workfunction layer 312 includes a metal. As described in exemplary embodiments below, a first source or drain structure is at a first side of the gate electrode, and a second source or drain structure is at a second side of the gate electrode opposite the first side.

In an embodiment, the high-k dielectric layer 308 is an $HfO_2$ layer. In one such embodiment, the gate electrode is an N-type gate electrode, and the dipole layer 310A includes a material selected from the group consisting of $Al_2O_3$, $TiO_2$, and $ZrO_2$. In another such embodiment, the gate electrode is a P-type gate electrode, and the dipole layer 310A includes a material selected from the group consisting of $La_2O_3$, $Y_2O_3$, MgO, SrO and $Lu_2O_3$. In an embodiment, the dipole layer 310A has a thickness in the range of 1-3 Angstroms. In an embodiment, the gate electrode is a Mid Gap-type gate electrode and the dipole layer 310A includes a material selected from the group consisting of $Al_2O_3$, $TiO_2$, $ZrO_2$, $HfO_2$, $La_2O_3$, $Y_2O_3$, MgO, SrO and $Lu_2O_3$.

In an embodiment, the gate electrode further includes a gate stressor layer 314 on the workfunction layer 312. In one such embodiment, the gate electrode is an N-type gate electrode, and the gate stressor layer 314 includes a metal selected from the group consisting of W, Ti, Mo, Cr and Al. In another such embodiment, the gate electrode is a P-type gate electrode, and the gate stressor layer 314 includes a metal selected from the group consisting of Ti, Ta, W, Mo, Sn and Zr.

In an embodiment, the gate dielectric further includes an amorphous oxide layer 304 between the dipole material layer 310A and the semiconductor channel structure 302. In one such embodiment, the amorphous oxide layer 304 is an $SiO_2$ layer.

In accordance with an embodiment of the present disclosure, dipole layers of different thicknesses are used to tune the threshold voltage and thus provide a multi-threshold voltage solution for scaled logic transistors. It is to be appreciated that the embodiments described herein can also include other implementations such as nanowires and/or nanoribbons with various widths, thicknesses and/or materials including but not limited to Si and SiGe. For example, group III-V materials may be used.

It is to be appreciated that, in a particular embodiment, nanowires or nanoribbons, or sacrificial intervening layers, may be composed of silicon. As used throughout, a silicon layer may be used to describe a silicon material composed of a very substantial amount of, if not all, silicon. However, it is to be appreciated that, practically, 100% pure Si may be difficult to form and, hence, could include a tiny percentage of carbon, germanium or tin. Such impurities may be included as an unavoidable impurity or component during deposition of Si or may "contaminate" the Si upon diffusion during post deposition processing. As such, embodiments described herein directed to a silicon layer may include a silicon layer that contains a relatively small amount, e.g., "impurity" level, non-Si atoms or species, such as Ge, C or Sn. It is to be appreciated that a silicon layer as described herein may be undoped or may be doped with dopant atoms such as boron, phosphorous or arsenic.

It is to be appreciated that, in a particular embodiment, nanowires or nanoribbons, or sacrificial intervening layers, may be composed of silicon germanium. As used throughout, a silicon germanium layer may be used to describe a silicon germanium material composed of substantial portions of both silicon and germanium, such as at least 5% of both. In some embodiments, the amount of germanium is greater than the amount of silicon. In particular embodiments, a silicon germanium layer includes approximately 60% germanium and approximately 40% silicon ($Si_{40}Ge_{60}$). In other embodiments, the amount of silicon is greater than the amount of germanium. In particular embodiments, a silicon germanium layer includes approximately 30% germanium and approximately 70% silicon ($Si_{70}Ge_{30}$). It is to be appreciated that, practically, 100% pure silicon germanium (referred to generally as SiGe) may be difficult to form and, hence, could include a tiny percentage of carbon or tin. Such impurities may be included as an unavoidable impurity or component during deposition of SiGe or may "contaminate" the SiGe upon diffusion during post deposition processing. As such, embodiments described herein directed to a silicon germanium layer may include a silicon germanium layer that contains a relatively small amount, e.g., "impurity" level, non-Ge and non-Si atoms or species, such as carbon or tin. It is to be appreciated that a silicon germanium layer as described herein may be undoped or may be doped with dopant atoms such as boron, phosphorous or arsenic.

Described below are various devices and processing schemes that may be used to fabricate a device that can be integrated with a common metal gate and with differentiated dipole layers. It is to be appreciated that the exemplary embodiments need not necessarily require all features described, or may include more features than are described. For example, nanowire release processing may be performed through a replacement gate trench. Examples of such release processes are described below. Additionally, in yet another aspect, backend (BE) interconnect scaling can result in lower performance and higher manufacturing cost due to patterning complexity. Embodiments described herein may be implemented to enable front-side and back-side interconnect integration for nanowire transistors. Embodiments described herein may provide an approach to achieve a relatively wider interconnect pitch. The result may be improved product performance and lower patterning costs. Embodiments may be implemented to enable robust functionality of scaled nanowire or nanoribbon transistors with low power and high performance.

One or more embodiments described herein are directed dual epitaxial (EPI) connections for nanowire or nanoribbon transistors using partial source or drain (SD) and asymmetric trench contact (TCN) depth. In an embodiment, an integrated circuit structure is fabricated by forming source-drain openings of nanowire/nanoribbon transistors which are partially filled with SD epitaxy. A remainder of the opening is filled with a conductive material. Deep trench formation on one of the source or drain side enables direct contact to a back-side interconnect level.

As an exemplary process flow for fabricating a gate-all-around device of a gate-all-around integrated circuit structure, FIGS. 4A-4J illustrates cross-sectional views of various operations in a method of fabricating a gate-all-around integrated circuit structure, in accordance with an embodiment of the present disclosure.

Figure 4B:
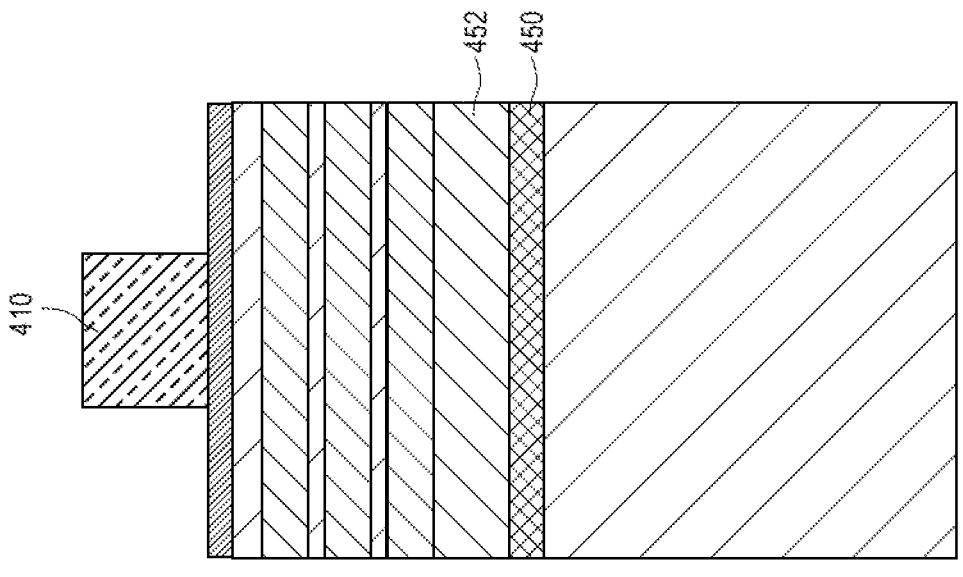
Figure 4A:
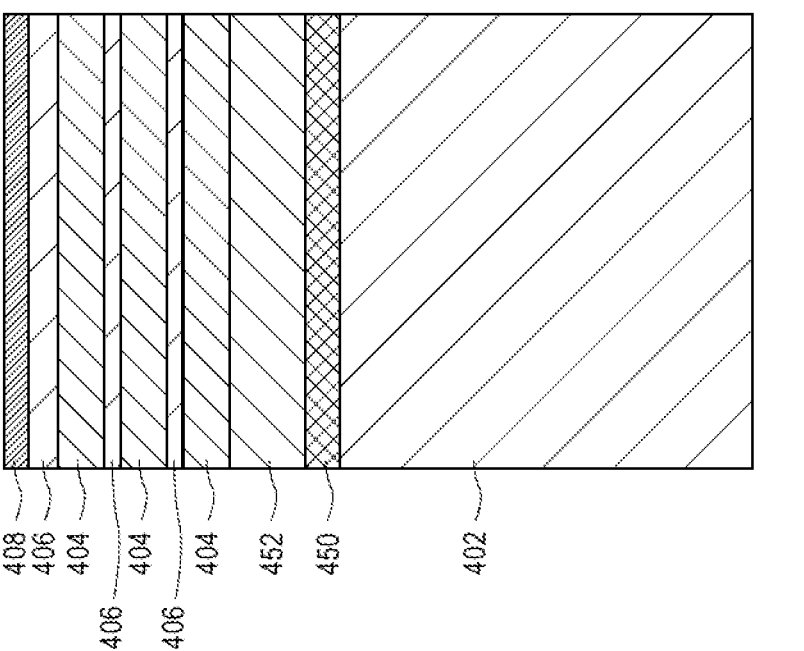

Referring to FIG. 4A, a method of fabricating an integrated circuit structure includes forming a starting stack which includes alternating sacrificial layers 404 and nanowires 406 above a fin 402, such as a silicon fin. The nanowires 406 may be referred to as a vertical arrangement of nanowires. A protective cap 408 may be formed above the alternating sacrificial layers 404 and nanowires 406, as is depicted. A relaxed buffer layer 452 and a defect modification layer 450 may be formed beneath the alternating sacrificial layers 404 and nanowires 406, as is also depicted.

Referring to FIG. 4B, a gate stack 410 is formed over the vertical arrangement of horizontal nanowires 406. Portions of the vertical arrangement of horizontal nanowires 406 are then released by removing portions of the sacrificial layers 404 to provide recessed sacrificial layers 404' and cavities 412, as is depicted in FIG. 4C.

It is to be appreciated that the structure of FIG. 4C may be fabricated to completion without first performing the deep etch and asymmetric contact processing described below. In either case (e.g., with or without asymmetric contact processing), in an embodiment, a fabrication process involves use of a process scheme that provides a gate-all-around integrated circuit structure having epitaxial nubs, which may be vertically discrete source or drain structures.

Figure 4D:
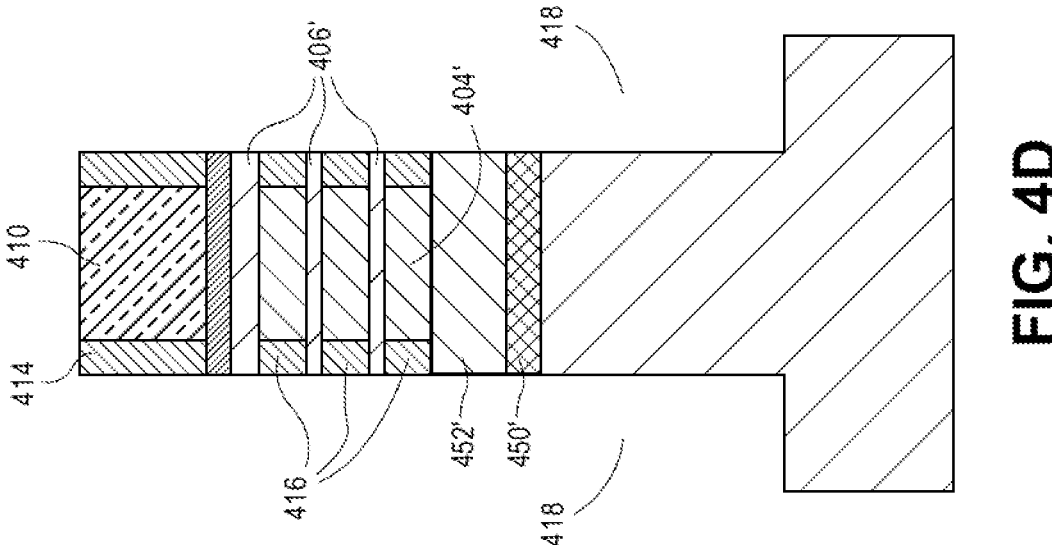
Figure 4C:
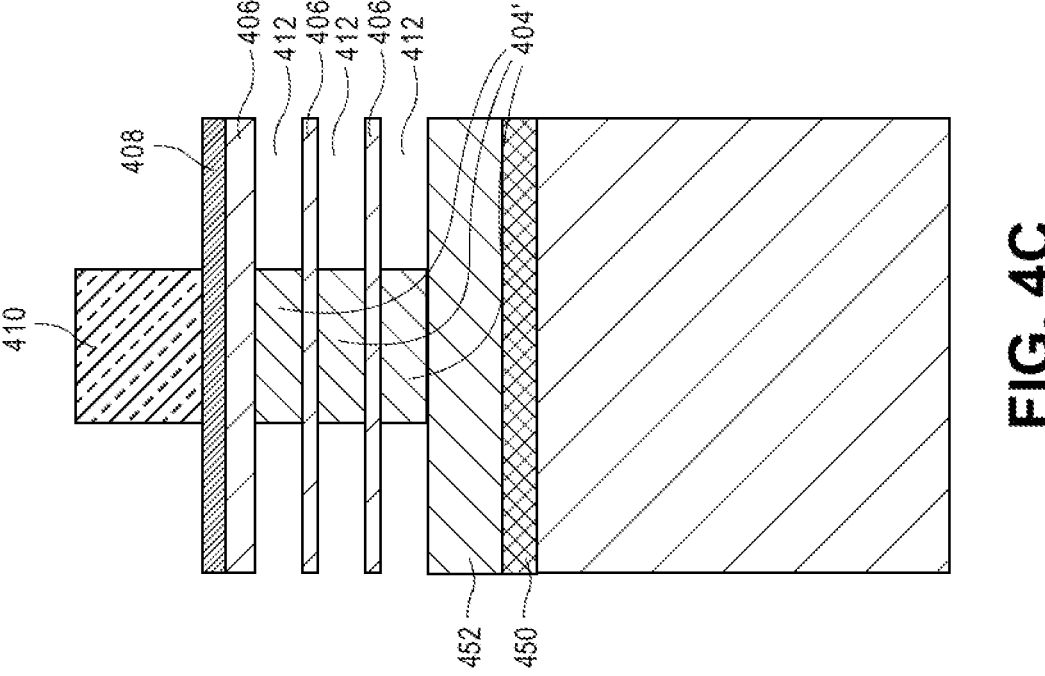

Referring to FIG. 4D, upper gate spacers 414 are formed at sidewalls of the gate structure 410. Cavity spacers 416 are formed in the cavities 412 beneath the upper gate spacers 414. A deep trench contact etch is then optionally performed to form trenches 418 and to form recessed nanowires 406'. A patterned relaxed buffer layer 452' and a patterned defect modification layer 450' may also be present, as is depicted.

Figures 4E, 4F, 4G:
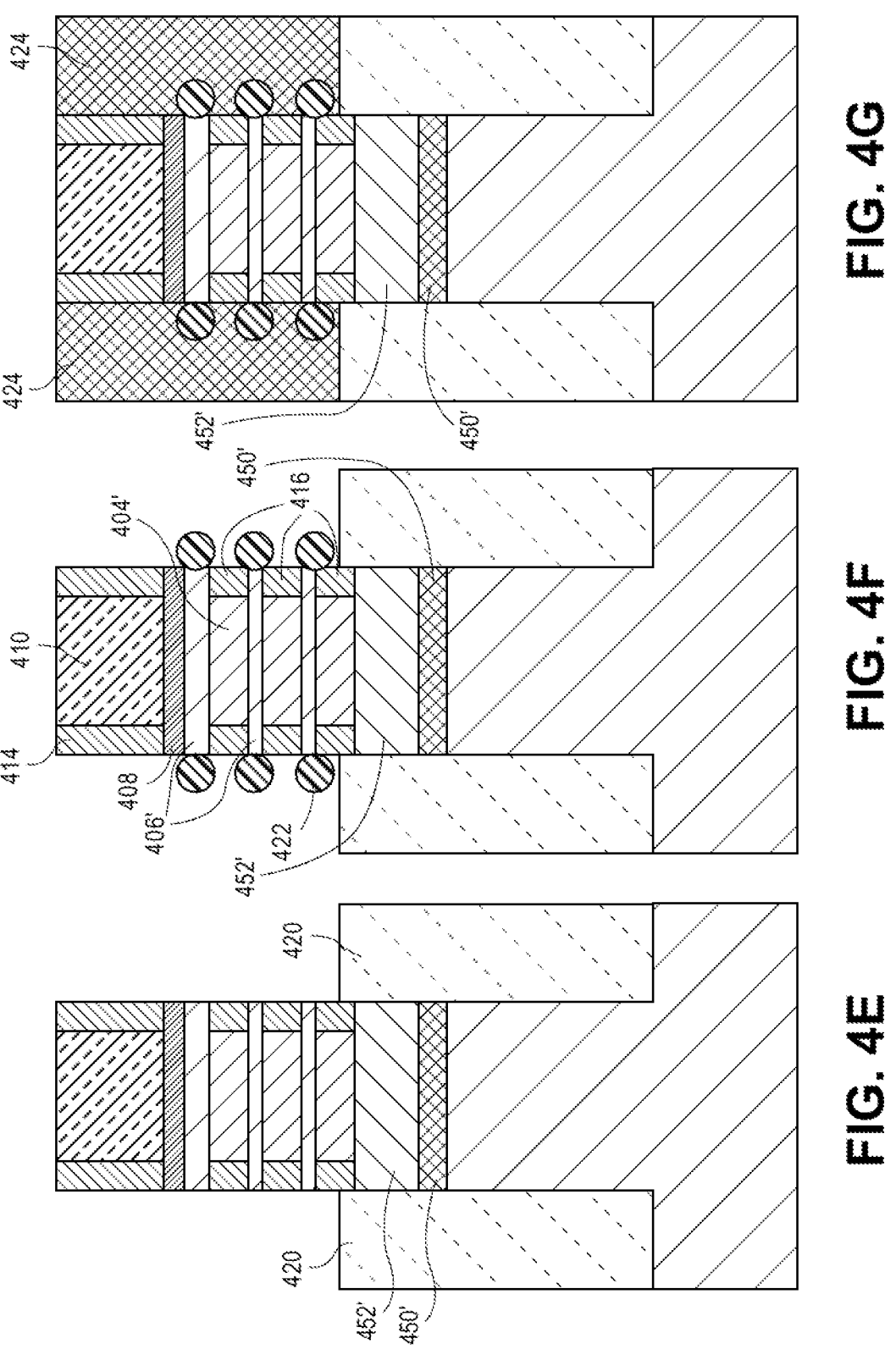

A sacrificial material 420 is then formed in the trenches 418, as is depicted in FIG. 4E. In other process schemes, an isolated trench bottom or silicon trench bottom may be used.

Referring to FIG. 4F, a first epitaxial source or drain structure (e.g., left-hand features 422) is formed at a first end of the vertical arrangement of horizontal nanowires 406'. A second epitaxial source or drain structure (e.g., right-hand features 422) is formed at a second end of the vertical arrangement of horizontal nanowires 406'. In an embodiment, as depicted, the epitaxial source or drain structures 422 are vertically discrete source or drain structures and may be referred to as epitaxial nubs.

Figures 4H, 4I, 4J:
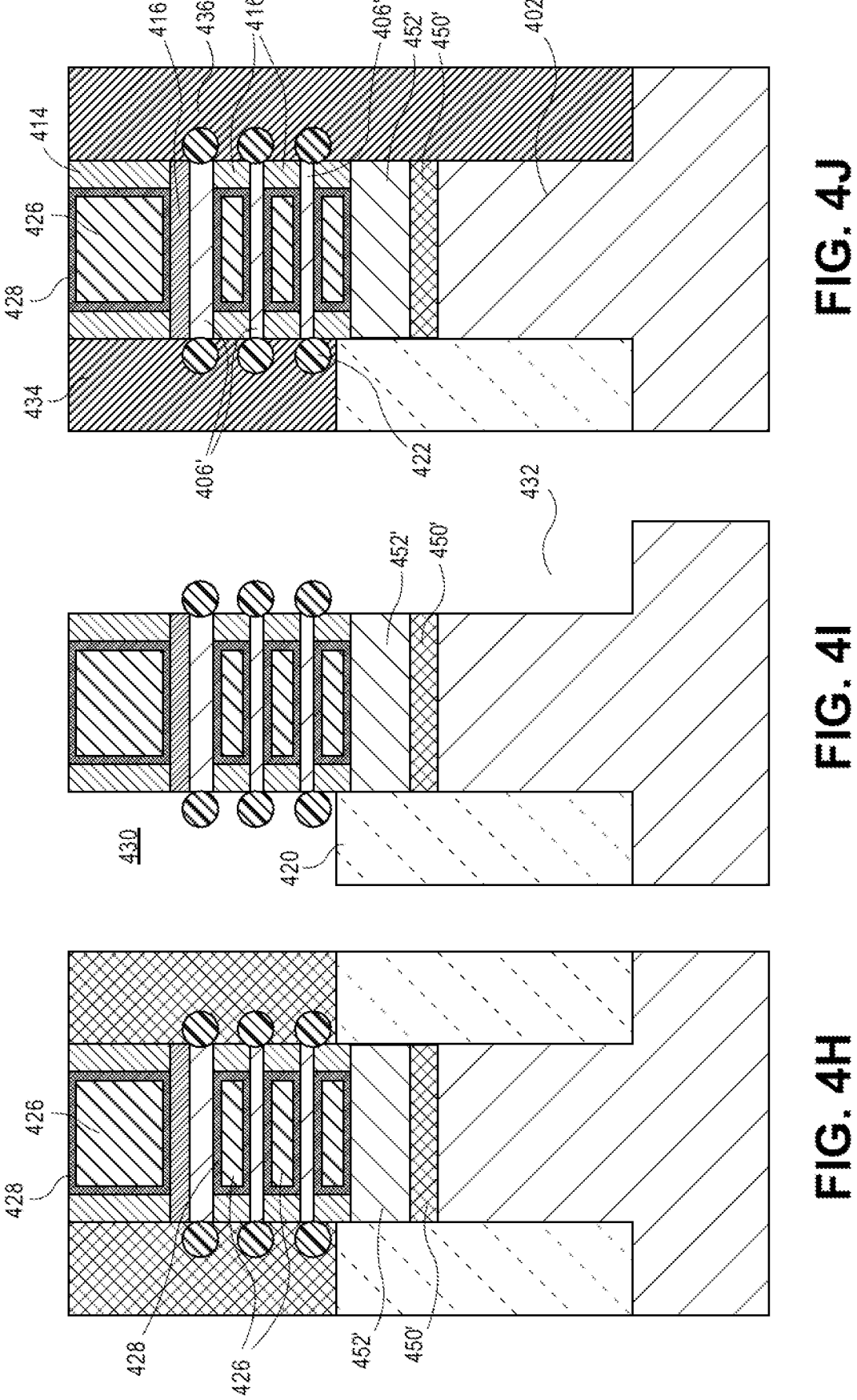

An inter-layer dielectric (ILD) material 424 is then formed at the sides of the gate electrode 410 and adjacent the source or drain structures 422, as is depicted in FIG. 4G. Referring to FIG. 4H, a replacement gate process is used to form a permanent gate dielectric 428 and a permanent gate electrode 426. The ILD material 424 is then removed, as is depicted in FIG. 4I. The sacrificial material 420 is then removed from one of the source drain locations (e.g., right-hand side) to form trench 432, but is not removed from the other of the source drain locations to form trench 430.

Referring to FIG. 4J, a first conductive contact structure 434 is formed coupled to the first epitaxial source or drain structure (e.g., left-hand features 422). A second conductive contact structure 436 is formed coupled to the second epitaxial source or drain structure (e.g., right-hand features 422). The second conductive contact structure 436 is formed deeper along the fin 402 than the first conductive contact structure 434. In an embodiment, although not depicted in FIG. 4J, the method further includes forming an exposed surface of the second conductive contact structure 436 at a bottom of the fin 402. Conductive contacts may include a contact resistance reducing layer and a primary contact electrode layer, where examples can include Ti, Ni, Co (for the former and W, Ru, Co for the latter.)

In an embodiment, the second conductive contact structure 436 is deeper along the fin 402 than the first conductive contact structure 434, as is depicted. In one such embodiment, the first conductive contact structure 434 is not along the fin 402, as is depicted. In another such embodiment, not depicted, the first conductive contact structure 434 is partially along the fin 402.

In an embodiment, the second conductive contact structure 436 is along an entirety of the fin 402. In an embodiment, although not depicted, in the case that the bottom of the fin 402 is exposed by a back-side substrate removal process, the second conductive contact structure 436 has an exposed surface at a bottom of the fin 402.

In an embodiment, the structure of FIG. 4J, or related structures of FIGS. 4A-4J, is formed using a common metal gate and a gate dielectric dipole layer approach, such as described in association with FIGS. 1A, 1B, 2 and 3.

In another aspect, in order to enable access to both conductive contact structures of a pair of asymmetric source and drain contact structures, integrated circuit structures described herein may be fabricated using a back-side reveal of front-side structures fabrication approach. In some exemplary embodiments, reveal of the back-side of a transistor or other device structure entails wafer-level back-side processing. In contrast to a conventional TSV-type technology, a reveal of the back-side of a transistor as described herein may be performed at the density of the device cells, and even within sub-regions of a device. Furthermore, such a reveal of the back-side of a transistor may be performed to remove substantially all of a donor substrate upon which a device layer was disposed during front-side device processing. As such, a microns-deep TSV becomes unnecessary with the thickness of semiconductor in the device cells following a reveal of the back-side of a transistor potentially being only tens or hundreds of nanometers.

Reveal techniques described herein may enable a paradigm shift from "bottom-up" device fabrication to "center-out" fabrication, where the "center" is any layer that is employed in front-side fabrication, revealed from the back-side, and again employed in back-side fabrication. Processing of both a front-side and revealed back-side of a device structure may address many of the challenges associated with fabricating 3D ICs when primarily relying on front-side processing.

A reveal of the back-side of a transistor approach may be employed for example to remove at least a portion of a carrier layer and intervening layer of a donor-host substrate assembly. The process flow begins with an input of a donor-host substrate assembly. A thickness of a carrier layer in the donor-host substrate is polished (e.g., CMP) and/or etched with a wet or dry (e.g., plasma) etch process. Any grind, polish, and/or wet/dry etch process known to be suitable for the composition of the carrier layer may be employed. For example, where the carrier layer is a group IV semiconductor (e.g., silicon) a CMP slurry known to be suitable for thinning the semiconductor may be employed.

Likewise, any wet etchant or plasma etch process known to be suitable for thinning the group IV semiconductor may also be employed.

In some embodiments, the above is preceded by cleaving the carrier layer along a fracture plane substantially parallel to the intervening layer. The cleaving or fracture process may be utilized to remove a substantial portion of the carrier layer as a bulk mass, reducing the polish or etch time needed to remove the carrier layer. For example, where a carrier layer is 400-900 µm in thickness, 100-700 µm may be cleaved off by practicing any blanket implant known to promote a wafer-level fracture. In some exemplary embodiments, a light element (e.g., H, He, or Li) is implanted to a uniform target depth within the carrier layer where the fracture plane is desired. Following such a cleaving process, the thickness of the carrier layer remaining in the donor-host substrate assembly may then be polished or etched to complete removal. Alternatively, where the carrier layer is not fractured, the grind, polish and/or etch operation may be employed to remove a greater thickness of the carrier layer.

Next, exposure of an intervening layer is detected. Detection is used to identify a point when the back-side surface of the donor substrate has advanced to nearly the device layer. Any endpoint detection technique known to be suitable for detecting a transition between the materials employed for the carrier layer and the intervening layer may be practiced. In some embodiments, one or more endpoint criteria are based on detecting a change in optical absorbance or emission of the back-side surface of the donor substrate during the polishing or etching performance. In some other embodiments, the endpoint criteria are associated with a change in optical absorbance or emission of byproducts during the polishing or etching of the donor substrate back-side surface. For example, absorbance or emission wavelengths associated with the carrier layer etch byproducts may change as a function of the different compositions of the carrier layer and intervening layer. In other embodiments, the endpoint criteria are associated with a change in mass of species in byproducts of polishing or etching the back-side surface of the donor substrate. For example, the byproducts of processing may be sampled through a quadrupole mass analyzer and a change in the species mass may be correlated to the different compositions of the carrier layer and intervening layer. In another exemplary embodiment, the endpoint criteria is associated with a change in friction between a back-side surface of the donor substrate and a polishing surface in contact with the back-side surface of the donor substrate.

Detection of the intervening layer may be enhanced where the removal process is selective to the carrier layer relative to the intervening layer as non-uniformity in the carrier removal process may be mitigated by an etch rate delta between the carrier layer and intervening layer. Detection may even be skipped if the grind, polish and/or etch operation removes the intervening layer at a rate sufficiently below the rate at which the carrier layer is removed. If an endpoint criteria is not employed, a grind, polish and/or etch operation of a predetermined fixed duration may stop on the intervening layer material if the thickness of the intervening layer is sufficient for the selectivity of the etch. In some examples, the carrier etch rate:intervening layer etch rate is 3:1-10:1, or more.

Upon exposing the intervening layer, at least a portion of the intervening layer may be removed. For example, one or more component layers of the intervening layer may be removed. A thickness of the intervening layer may be removed uniformly by a polish, for example. Alternatively, a thickness of the intervening layer may be removed with a masked or blanket etch process. The process may employ the same polish or etch process as that employed to thin the carrier, or may be a distinct process with distinct process parameters. For example, where the intervening layer provides an etch stop for the carrier removal process, the latter operation may employ a different polish or etch process that favors removal of the intervening layer over removal of the device layer. Where less than a few hundred nanometers of intervening layer thickness is to be removed, the removal process may be relatively slow, optimized for across-wafer uniformity, and more precisely controlled than that employed for removal of the carrier layer. A CHIP process employed may, for example employ a slurry that offers very high selectively (e.g., 100:1-300:1, or more) between semiconductor (e.g., silicon) and dielectric material (e.g., SiO) surrounding the device layer and embedded within the intervening layer, for example, as electrical isolation between adjacent device regions.

For embodiments where the device layer is revealed through complete removal of the intervening layer, backside processing may commence on an exposed back-side of the device layer or specific device regions there in. In some embodiments, the back-side device layer processing includes a further polish or wet/dry etch through a thickness of the device layer disposed between the intervening layer and a device region previously fabricated in the device layer, such as a source or drain region.

In some embodiments where the carrier layer, intervening layer, or device layer back-side is recessed with a wet and/or plasma etch, such an etch may be a patterned etch or a materially selective etch that imparts significant non-planarity or topography into the device layer back-side surface. As described further below, the patterning may be within a device cell (i.e., "intra-cell" patterning) or may be across device cells (i.e., "inter-cell" patterning). In some patterned etch embodiments, at least a partial thickness of the intervening layer is employed as a hard mask for back-side device layer patterning. Hence, a masked etch process may preface a correspondingly masked device layer etch.

The above described processing scheme may result in a donor-host substrate assembly that includes IC devices that have a back-side of an intervening layer, a back-side of the device layer, and/or back-side of one or more semiconductor regions within the device layer, and/or front-side metallization revealed. Additional back-side processing of any of these revealed regions may then be performed during downstream processing.

It is to be appreciated that the structures resulting from the above exemplary processing schemes may be used in a same or similar form for subsequent processing operations to complete device fabrication, such as PMOS and/or NMOS device fabrication. As an example of a completed device, FIG. 5 illustrates a cross-sectional view of a non-planar integrated circuit structure as taken along a gate line, in accordance with an embodiment of the present disclosure.

Referring to FIG. 5, a semiconductor structure or device 500 includes a non-planar active region (e.g., a fin structure including protruding fin portion 504 and sub-fin region 505) within a trench isolation region 506. In an embodiment, instead of a solid fin, the non-planar active region is separated into nanowires (such as nanowires 504A and 504B) above sub-fin region 505, as is represented by the dashed lines. In either case, for ease of description for non-planar integrated circuit structure 500, a non-planar active region 504 is referenced below as a protruding fin portion. In an embodiment, the sub-fin region 505 also includes a relaxed buffer layer 542 and a defect modification layer 540, as is depicted.

A gate line 508 is disposed over the protruding portions 504 of the non-planar active region (including, if applicable, surrounding nanowires 504A and 504B), as well as over a portion of the trench isolation region 506. As shown, gate line 508 includes a gate electrode 550 and a gate dielectric layer 552. In one embodiment, gate line 508 may also include a dielectric cap layer 554. A gate contact 514, and overlying gate contact via 516 are also seen from this perspective, along with an overlying metal interconnect 560, all of which are disposed in inter-layer dielectric stacks or layers 570. Also seen from the perspective of FIG. 5, the gate contact 514 is, in one embodiment, disposed over trench isolation region 506, but not over the non-planar active regions. In another embodiment, the gate contact 514 is over the non-planar active regions.

In an embodiment, the semiconductor structure or device 500 is a non-planar device such as, but not limited to, a fin-FET device, a tri-gate device, a nanoribbon device, or a nanowire device. In such an embodiment, a corresponding semiconducting channel region is composed of or is formed in a three-dimensional body. In one such embodiment, the gate electrode stacks of gate lines 508 surround at least a top surface and a pair of sidewalls of the three-dimensional body.

As is also depicted in FIG. 5, in an embodiment, an interface 580 exists between a protruding fin portion 504 and sub-fin region 505. The interface 580 can be a transition region between a doped sub-fin region 505 and a lightly or undoped upper fin portion 504. In one such embodiment, each fin is approximately 10 nanometers wide or less, and sub-fin dopants are optionally supplied from an adjacent solid state doping layer at the sub-fin location. In a particular such embodiment, each fin is less than 10 nanometers wide.

Although not depicted in FIG. 5, it is to be appreciated that source or drain regions of or adjacent to the protruding fin portions 504 are on either side of the gate line 508, i.e., into and out of the page. In one embodiment, the material of the protruding fin portions 504 in the source or drain locations is removed and replaced with another semiconductor material, e.g., by epitaxial deposition to form epitaxial source or drain structures. The source or drain regions may extend below the height of dielectric layer of trench isolation region 506, i.e., into the sub-fin region 505. In accordance with an embodiment of the present disclosure, the more heavily doped sub-fin regions, i.e., the doped portions of the fins below interface 580, inhibits source to drain leakage through this portion of the bulk semiconductor fins. In an embodiment, the source and drain regions have associated asymmetric source and drain contact structures, as described above in association with FIG. 4J.

With reference again to FIG. 5, in an embodiment, fins 504/505 (and, possibly nanowires 504A and 504B) are composed of a crystalline silicon germanium layer which may be doped with a charge carrier, such as but not limited to phosphorus, arsenic, boron, gallium or a combination thereof.

In an embodiment, trench isolation region 506, and trench isolation regions (trench isolations structures or trench isolation layers) described throughout, may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, trench isolation region 506 is composed of a dielectric material such as, but not limited to, silicon dioxide, silicon oxy-nitride, silicon nitride, or carbon-doped silicon nitride.

Gate line 508 may be composed of a gate electrode stack which includes a gate dielectric layer 552 and a gate electrode layer 550. In an embodiment, the gate electrode of the gate electrode stack is composed of a metal gate and the gate dielectric layer is composed of a high-k material. For example, in one embodiment, the gate dielectric layer 552 is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer 552 may include a layer of native oxide formed from the top few layers of the substrate fin 504. In an embodiment, the gate dielectric layer 552 is composed of a top high-k portion and a lower portion composed of an oxide of a semiconductor material. In one embodiment, the gate dielectric layer 552 is composed of a top portion of hafnium oxide and a bottom portion of silicon dioxide or silicon oxy-nitride. In some implementations, a portion of the gate dielectric is a "U"-shaped structure that includes a bottom portion substantially parallel to the surface of the substrate and two sidewall portions that are substantially perpendicular to the top surface of the substrate.

In one embodiment, the gate electrode layer 550 is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode layer 550 is composed of a non-workfunction-setting fill material formed above a metal workfunction-setting layer. The gate electrode layer 550 may consist of a P-type workfunction metal or an N-type workfunction metal, depending on whether the transistor is to be a PMOS or an NMOS transistor. In some implementations, the gate electrode layer 550 may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, tungsten and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Gate contact 514 and overlying gate contact via 516 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material).

In an embodiment (although not shown), a contact pattern which is essentially perfectly aligned to an existing gate pattern 508 is formed while eliminating the use of a lithographic step with exceedingly tight registration budget. In an embodiment, the contact pattern is a vertically symmetric contact pattern, or an asymmetric contact pattern such as described in association with FIG. 4J. In other embodiments, all contacts are front-side connected and are not asymmetric. In one such embodiment, the self-aligned approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

In an embodiment, providing structure 500 involves fabrication of the gate stack structure 508 by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

Referring again to FIG. 5, the arrangement of semiconductor structure or device 500 places the gate contact over isolation regions. Such an arrangement may be viewed as inefficient use of layout space. In another embodiment, however, a semiconductor device has contact structures that contact portions of a gate electrode formed over an active region, e.g., over a fin 505, and in a same layer as a trench contact via.

In an embodiment, the structure of FIG. 5 is formed using a common metal gate and a gate dielectric dipole layer approach, such as described in association with FIGS. 1A, 1B, 2 and 3.

It is to be appreciated that not all aspects of the processes described above need be practiced to fall within the spirit and scope of embodiments of the present disclosure. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a nanowire device, a nanoribbon device, a tri-gate device, an independently accessed double gate device, or a FIN-FET. One or more embodiments may be particularly useful for fabricating semiconductor devices at a sub-10 nanometer (10 nm) technology node.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials, capping layers, or plugs are composed of dielectric materials different from the interlayer dielectric material. In one embodiment, different hardmask, capping or plug materials may be used in different regions so as to provide different growth or etch selectivity to each other and to the underlying dielectric and metal layers. In some embodiments, a hardmask layer, capping or plug layer includes a layer of a nitride of silicon (e.g., silicon nitride) or a layer of an oxide of silicon, or both, or a combination thereof. Other suitable materials may include carbon-based materials. Other hardmask, capping or plug layers known in the arts may be used depending upon the particular implementation. The hardmask, capping or plug layers maybe formed by CVD, PVD, or by other deposition methods.

In an embodiment, as is also used throughout the present description, lithographic operations are performed using 193 nm immersion lithography (i193), EUV and/or EBDW lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

In another aspect, one or more embodiments are directed to neighboring semiconductor structures or devices separated by self-aligned gate endcap (SAGE) structures. Particular embodiments may be directed to integration of multiple width (multi-Wsi) nanowires and nanoribbons in a SAGE architecture and separated by a SAGE wall. In an embodiment, nanowires/nanoribbons are integrated with multiple Wsi in a SAGE architecture portion of a front-end process flow. Such a process flow may involve integration of nanowires and nanoribbons of different Wsi to provide robust functionality of next generation transistors with low power and high performance. Associated epitaxial source or drain regions may be embedded (e.g., portions of nanowires removed and then source or drain (S/D) growth is performed).

To provide further context, advantages of a self-aligned gate endcap (SAGE) architecture may include the enabling of higher layout density and, in particular, scaling of diffusion to diffusion spacing. To provide illustrative comparison, FIG. 6 illustrates cross-sectional views taken through nanowires and fins for a non-endcap architecture (left-hand side (a)) versus a self-aligned gate endcap (SAGE) architecture (right-hand side (b)), in accordance with an embodiment of the present disclosure.

Referring to the left-hand side (a) of FIG. 6, an integrated circuit structure 600 includes a substrate 602 having fins 604 protruding there from by an amount 606 above an isolation structure 608 laterally surrounding lower portions of the fins 604. Upper portions of the fins may include a relaxed buffer layer 622 and a defect modification layer 620, as is depicted. Corresponding nanowires 605 are over the fins 604. A gate structure may be formed over the integrated circuit structure 600 to fabricate a device. However, breaks in such a gate structure may be accommodated for by increasing the spacing between fin 604/nanowire 605 pairs.

By contrast, referring to the right-hand side (b) of FIG. 6, an integrated circuit structure 650 includes a substrate 652 having fins 654 protruding therefrom by an amount 656 above an isolation structure 658 laterally surrounding lower portions of the fins 654. Upper portions of the fins may include a relaxed buffer layer 672 and a defect modification layer 670, as is depicted. Corresponding nanowires 655 are over the fins 654. Isolating SAGE walls 660 (which may include a hardmask thereon, as depicted) are included within the isolation structure 652 and between adjacent fin 654/nanowire 655 pairs. The distance between an isolating SAGE wall 660 and a nearest fin 654/nanowire 655 pair defines the gate endcap spacing 662. A gate structure may be formed over the integrated circuit structure 600, between insolating SAGE walls to fabricate a device. Breaks in such a gate structure are imposed by the isolating SAGE walls. Since the isolating SAGE walls 660 are self-aligned, restrictions from conventional approaches can be minimized to enable more aggressive diffusion to diffusion spacing. Furthermore, since gate structures include breaks at all locations, individual gate structure portions may be layer connected by local interconnects formed over the isolating SAGE walls 660. In an embodiment, as depicted, the SAGE walls 660 each include a lower dielectric portion and a dielectric cap on the lower dielectric portion. In accordance with an embodiment of the present disclosure, a fabrication process for structures associated with FIG. 6 involves use of a process scheme that provides a gate-all-around integrated circuit structure having epitaxial source or drain structures.

In an embodiment, the structure of part (b) of FIG. 6 is formed using a common metal gate and a gate dielectric dipole layer approach, such as described in association with FIGS. 1A, 1B, 2 and 3.

A self-aligned gate endcap (SAGE) processing scheme involves the formation of gate/trench contact endcaps self-aligned to fins without requiring an extra length to account for mask mis-registration. Thus, embodiments may be implemented to enable shrinking of transistor layout area. Embodiments described herein may involve the fabrication of gate endcap isolation structures, which may also be referred to as gate walls, isolation gate walls or self-aligned gate endcap (SAGE) walls.

In an exemplary processing scheme for structures having SAGE walls separating neighboring devices, FIG. 7 illustrate cross-sectional views representing various operations in a method of fabricating a self-aligned gate endcap (SAGE) structure with gate-all-around devices, in accordance with an embodiment of the present disclosure.

Referring to part (a) of FIG. 7, a starting structure includes a nanowire patterning stack 704 above a substrate 702. A lithographic patterning stack 706 is formed above the nanowire patterning stack 704. The nanowire patterning stack 704 includes alternating sacrificial layers 710 and nanowire layers 712, which may be above a relaxed buffer layer 782 and a defect modification layer 780, as is depicted. A protective mask 714 is between the nanowire patterning stack 704 and the lithographic patterning stack 706. In one embodiment, the lithographic patterning stack 706 is trilayer mask composed of a topographic masking portion 720, an anti-reflective coating (ARC) layer 722, and a photoresist layer 724. In a particular such embodiment, the topographic masking portion 720 is a carbon hardmask (CHM) layer and the anti-reflective coating layer 722 is a silicon ARC layer.

Referring to part (b) of FIG. 7, the stack of part (a) is lithographically patterned and then etched to provide an etched structure including a patterned substrate 702 and trenches 730.

Referring to part (c) of FIG. 7, the structure of part (b) has an isolation layer 740 and a SAGE material 742 formed in trenches 730. The structure is then planarized to leave patterned topographic masking layer 720' as an exposed upper layer.

Referring to part (d) of FIG. 7, the isolation layer 740 is recessed below an upper surface of the patterned substrate 702, e.g., to define a protruding fin portion and to provide a trench isolation structure 741 beneath SAGE walls 742.

Referring to part (e) of FIG. 7, the sacrificial layers 710 are removed at least in the channel region to release nanowires 712A and 712B. Subsequent to the formation of the structure of part (e) of FIG. 7, a gate stacks may be formed around nanowires 712B or 712A, over protruding fins of substrate 702, and between SAGE walls 742. In one embodiment, prior to formation of the gate stacks, the remaining portion of protective mask 714 is removed. In another embodiment, the remaining portion of protective mask 714 is retained as an insulating fin hat as an artifact of the processing scheme.

Referring again to part (e) of FIG. 7, it is to be appreciated that a channel view is depicted, with source or drain regions being locating into and out of the page. In an embodiment, the channel region including nanowires 712B has a width less than the channel region including nanowires 712A. Thus, in an embodiment, an integrated circuit structure includes multiple width (multi-Wsi) nanowires. Although structures of 712B and 712A may be differentiated as nanowires and nanoribbons, respectively, both such structures are typically referred to herein as nanowires. It is also to be appreciated that reference to or depiction of a fin/nanowire pair throughout may refer to a structure including a fin and one or more overlying nanowires (e.g., two overlying nanowires are shown in FIG. 7). In accordance with an embodiment of the present disclosure, a fabrication process for structures associated with FIG. 7 involves use of a process scheme that provides a gate-all-around integrated circuit structure having epitaxial source or drain structures.

In an embodiment, the structure of part (e) FIG. 7 is formed using a common metal gate and a gate dielectric dipole layer approach, such as described in association with FIGS. 1A, 1B, 2 and 3.

In an embodiment, as described throughout, self-aligned gate endcap (SAGE) isolation structures may be composed of a material or materials suitable to ultimately electrically isolate, or contribute to the isolation of, portions of permanent gate structures from one another. Exemplary materials or material combinations include a single material structure such as silicon dioxide, silicon oxy-nitride, silicon nitride, or carbon-doped silicon nitride. Other exemplary materials or material combinations include a multi-layer stack having lower portion silicon dioxide, silicon oxy-nitride, silicon nitride, or carbon-doped silicon nitride and an upper portion higher dielectric constant material such as hafnium oxide.

To highlight an exemplary integrated circuit structure having three vertically arranged nanowires, FIG. 8A illustrates a three-dimensional cross-sectional view of a nanowire-based integrated circuit structure, in accordance with an embodiment of the present disclosure. FIG. 8B illustrates a cross-sectional source or drain view of the nanowire-based integrated circuit structure of FIG. 8A, as taken along the a-a' axis. FIG. 8C illustrates a cross-sectional channel view of the nanowire-based integrated circuit structure of FIG. 8A, as taken along the b-b' axis.

Referring to FIG. 8A, an integrated circuit structure 800 includes one or more vertically stacked nanowires (804 set) above a substrate 802. In an embodiment, as depicted, a relaxed buffer layer 802C, a defect modification layer 802B, and a lower substrate portion 802A are included in substrate 802, as is depicted. An optional fin below the bottommost nanowire and formed from the substrate 802 is not depicted for the sake of emphasizing the nanowire portion for illustrative purposes. Embodiments herein are targeted at both single wire devices and multiple wire devices. As an example, a three nanowire-based devices having nanowires 804A, 804B and 804C is shown for illustrative purposes. For convenience of description, nanowire 804A is used as an example where description is focused on one of the nanowires. It is to be appreciated that where attributes of one nanowire are described, embodiments based on a plurality of nanowires may have the same or essentially the same attributes for each of the nanowires.

Each of the nanowires 804 includes a channel region 806 in the nanowire. The channel region 806 has a length (L).

Referring to FIG. 8C, the channel region also has a perimeter (Pc) orthogonal to the length (L). Referring to both FIGS. 8A and 8C, a gate electrode stack 808 surrounds the entire perimeter (Pc) of each of the channel regions 806. The gate electrode stack 808 includes a gate electrode along with a gate dielectric layer between the channel region 806 and the gate electrode (not shown). In an embodiment, the channel region is discrete in that it is completely surrounded by the gate electrode stack 808 without any intervening material such as underlying substrate material or overlying channel fabrication materials. Accordingly, in embodiments having a plurality of nanowires 804, the channel regions 806 of the nanowires are also discrete relative to one another.

Referring to both FIGS. 8A and 8B, integrated circuit structure 800 includes a pair of non-discrete source or drain regions 810/812. The pair of non-discrete source or drain regions 810/812 is on either side of the channel regions 806 of the plurality of vertically stacked nanowires 804. Furthermore, the pair of non-discrete source or drain regions 810/812 is adjoining for the channel regions 806 of the plurality of vertically stacked nanowires 804. In one such embodiment, not depicted, the pair of non-discrete source or drain regions 810/812 is directly vertically adjoining for the channel regions 806 in that epitaxial growth is on and between nanowire portions extending beyond the channel regions 806, where nanowire ends are shown within the source or drain structures. In another embodiment, as depicted in FIG. 8A, the pair of non-discrete source or drain regions 810/812 is indirectly vertically adjoining for the channel regions 806 in that they are formed at the ends of the nanowires and not between the nanowires.

In an embodiment, as depicted, the source or drain regions 810/812 are non-discrete in that there are not individual and discrete source or drain regions for each channel region 806 of a nanowire 804. Accordingly, in embodiments having a plurality of nanowires 804, the source or drain regions 810/812 of the nanowires are global or unified source or drain regions as opposed to discrete for each nanowire. That is, the non-discrete source or drain regions 810/812 are global in the sense that a single unified feature is used as a source or drain region for a plurality (in this case, 3) of nanowires 804 and, more particularly, for more than one discrete channel region 806. In one embodiment, from a cross-sectional perspective orthogonal to the length of the discrete channel regions 806, each of the pair of non-discrete source or drain regions 810/812 is approximately rectangular in shape with a bottom tapered portion and a top vertex portion, as depicted in FIG. 8B. In other embodiments, however, the source or drain regions 810/812 of the nanowires are relatively larger yet discrete non-vertically merged epitaxial structures such as nubs described in association with FIGS. 4A-4J.

In accordance with an embodiment of the present disclosure, and as depicted in FIGS. 8A and 8B, integrated circuit structure 800 further includes a pair of contacts 814, each contact 814 on one of the pair of non-discrete source or drain regions 810/812. In one such embodiment, in a vertical sense, each contact 814 completely surrounds the respective non-discrete source or drain region 810/812. In another aspect, the entire perimeter of the non-discrete source or drain regions 810/812 may not be accessible for contact with contacts 814, and the contact 814 thus only partially surrounds the non-discrete source or drain regions 810/812, as depicted in FIG. 8B. In a contrasting embodiment, not depicted, the entire perimeter of the non-discrete source or drain regions 810/812, as taken along the a-a' axis, is surrounded by the contacts 814.

Referring again to FIG. 8A, in an embodiment, integrated circuit structure 800 further includes a pair of spacers 816. As is depicted, outer portions of the pair of spacers 816 may overlap portions of the non-discrete source or drain regions 810/812, providing for "embedded" portions of the non-discrete source or drain regions 810/812 beneath the pair of spacers 816. As is also depicted, the embedded portions of the non-discrete source or drain regions 810/812 may not extend beneath the entirety of the pair of spacers 816.

Substrate 802 may be composed of a material suitable for integrated circuit structure fabrication. In one embodiment, substrate 802 includes a lower bulk substrate composed of a single crystal of a material which may include, but is not limited to, silicon, germanium, silicon-germanium, germanium-tin, silicon-germanium-tin, or a group III-V compound semiconductor material. An upper insulator layer composed of a material which may include, but is not limited to, silicon dioxide, silicon nitride or silicon oxy-nitride is on the lower bulk substrate. Thus, the structure 800 may be fabricated from a starting semiconductor-on-insulator substrate. Alternatively, the structure 800 is formed directly from a bulk substrate and local oxidation is used to form electrically insulative portions in place of the above described upper insulator layer. In another alternative embodiment, the structure 800 is formed directly from a bulk substrate and doping is used to form electrically isolated active regions, such as nanowires, thereon. In one such embodiment, the first nanowire (i.e., proximate the substrate) is in the form of an omega-FET type structure.

In an embodiment, the nanowires 804 may be sized as wires or ribbons, as described below, and may have squared-off or rounder corners. In an embodiment, the nanowires 804 are composed of a material such as, but not limited to, silicon, germanium, or a combination thereof. In one such embodiment, the nanowires are single-crystalline. For example, for a silicon nanowire 804, a single-crystalline nanowire may be based from a (100) global orientation, e.g., with a <100> plane in the z-direction. As described below, other orientations may also be considered. In an embodiment, the dimensions of the nanowires 804, from a cross-sectional perspective, are on the nano-scale. For example, in a specific embodiment, the smallest dimension of the nanowires 804 is less than approximately 20 nanometers. In an embodiment, the nanowires 804 are composed of a strained material, particularly in the channel regions 806.

Referring to FIGS. 8C, in an embodiment, each of the channel regions 806 has a width (Wc) and a height (Hc), the width (Wc) approximately the same as the height (Hc). That is, in both cases, the channel regions 806 are square-like or, if corner-rounded, circle-like in cross-section profile. In another aspect, the width and height of the channel region need not be the same, such as the case for nanoribbons as described throughout.

In an embodiment, as described throughout, an integrated circuit structure includes non-planar devices such as, but not limited to, a finFET or a tri-gate device with corresponding one or more overlying nanowire structures. In such an embodiment, a corresponding semiconducting channel region is composed of or is formed in a three-dimensional body with one or more discrete nanowire channel portions overlying the three-dimensional body. In one such embodiment, the gate structures surround at least a top surface and a pair of sidewalls of the three-dimensional body, and further surrounds each of the one or more discrete nanowire channel portions.

In an embodiment, the structure of FIGS. 8A-8C is formed using a common metal gate and a gate dielectric dipole layer approach, such as described in association with FIGS. 1A, 1B, 2 and 3.

In an embodiment, as described throughout, an underlying substrate may be composed of a semiconductor material that can withstand a manufacturing process and in which charge can migrate. In an embodiment, the substrate is a bulk substrate composed of a crystalline silicon, silicon/germanium or germanium layer doped with a charge carrier, such as but not limited to phosphorus, arsenic, boron, gallium or a combination thereof, to form an active region. In one embodiment, the concentration of silicon atoms in a bulk substrate is greater than 97%. In another embodiment, a bulk substrate is composed of an epitaxial layer grown atop a distinct crystalline substrate, e.g. a silicon epitaxial layer grown atop a boron-doped bulk silicon mono-crystalline substrate. A bulk substrate may alternatively be composed of a group III-V material. In an embodiment, a bulk substrate is composed of a group III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, a bulk substrate is composed of a group III-V material and the charge-carrier dopant impurity atoms are ones such as, but not limited to, carbon, silicon, germanium, oxygen, sulfur, selenium or tellurium.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

FIG. 9 illustrates a computing device 900 in accordance with one implementation of an embodiment of the present disclosure. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touch-screen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. The integrated circuit die of the processor 904 may include one or more structures, such as gate-all-around integrated circuit structures having common metal gates and having gate dielectrics with differentiated dipole layers, built in accordance with implementations of embodiments of the present disclosure. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. The integrated circuit die of the communication chip 906 may include one or more structures, such as gate-all-around integrated circuit structures having common metal gates and having gate dielectrics with differentiated dipole layers, built in accordance with implementations of embodiments of the present disclosure.

In further implementations, another component housed within the computing device 900 may contain an integrated circuit die that includes one or structures, such as gate-all-around integrated circuit structures having common metal gates and having gate dielectrics with differentiated dipole layers, built in accordance with implementations of embodiments of the present disclosure.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

FIG. 10 illustrates an interposer 1000 that includes one or more embodiments of the present disclosure. The interposer 1000 is an intervening substrate used to bridge a first substrate 1002 to a second substrate 1004. The first substrate 1002 may be, for instance, an integrated circuit die. The second substrate 1004 may be, for instance, a memory module, a computer motherboard, or another integrated circuit die. Generally, the purpose of an interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first and second substrates 1002/1004 are attached to opposing sides of the interposer 1000. In other embodiments, the first and second substrates 1002/1004 are attached to the same side of the interposer 1000. And, in further embodiments, three or more substrates are interconnected by way of the interposer 1000.

The interposer 1000 may be formed of an epoxy resin, a fiberglass-reinforced epoxy resin, a ceramic material, or a polymer material such as polyimide. In further implementations, the interposer 1000 may be formed of alternate rigid or flexible materials that may include the same materials described above for use in a semiconductor substrate, such as silicon, germanium, and other group III-V and group IV materials.

The interposer 1000 may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1000. In accordance with embodiments of the disclosure, apparatuses or processes disclosed herein may be used in the fabrication of interposer 1000 or in the fabrication of components included in the interposer 1000.

Thus, embodiments of the present disclosure include gate-all-around integrated circuit structures having common metal gates and having gate dielectrics with differentiated dipole layers, and methods of fabricating gate-all-around integrated circuit structures having common metal gates and having gate dielectrics with differentiated dipole layers.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure includes a first vertical arrangement of horizontal nanowires, and a second vertical arrangement of horizontal nanowires. A P-type gate stack is over the first vertical arrangement of horizontal nanowires, the P-type gate stack having a mid-gap to P-type conductive layer over a first gate dielectric including a high-k dielectric layer and a first dipole material layer. An N-type gate stack is over the second vertical arrangement of horizontal nanowires, the N-type gate stack having the mid-gap to P-type conductive layer over a second gate dielectric including the high-k dielectric layer and a second dipole material layer, the second dipole layer different than the first dipole material layer.

Example embodiment 2: The integrated circuit structure of example embodiment 1, wherein the high-k dielectric layer includes hafnium and oxygen.

Example embodiment 3: The integrated circuit structure of example embodiment 1 or 2, wherein the first dipole material layer includes an oxide of Al, Ti, Nb or Ga, and wherein the second dipole material layer includes an oxide of La, Mg, Y, Ba or Sr.

Example embodiment 4: The integrated circuit structure of example embodiment 1, 2 or 3, wherein the first dipole material layer or the second dipole material layer has a thickness in the range of 1-3 Angstroms.

Example embodiment 5: The integrated circuit structure of example embodiment 1, 2 or 3, wherein the first dipole material layer or the second dipole material layer has a thickness in the range of 4-6 Angstroms.

Example embodiment 6: The integrated circuit structure of example embodiment 1, 2, 3, 4 or 5, wherein the mid-gap to P-type conductive layer is continuous between the first vertical arrangement of horizontal nanowires and the second vertical arrangement of horizontal nanowires.

Example embodiment 7: An integrated circuit structure includes a first vertical arrangement of horizontal nanowires, and a second vertical arrangement of horizontal nanowires. A P-type gate stack is over the first vertical arrangement of horizontal nanowires, the P-type gate stack having a mid-gap to N-type conductive layer over a first gate dielectric including a high-k dielectric layer and a first dipole material layer. An N-type gate stack is over the second vertical arrangement of horizontal nanowires, the N-type gate stack having the mid-gap to N-type conductive layer over a second gate dielectric including the high-k dielectric layer and a second dipole material layer, the second dipole layer different than the first dipole material layer.

Example embodiment 8: The integrated circuit structure of example embodiment 7, wherein the high-k dielectric layer includes hafnium and oxygen.

Example embodiment 9: The integrated circuit structure of example embodiment 7 or 8, wherein the first dipole material layer includes an oxide of Al, Ti, Nb or Ga, and wherein the second dipole material layer includes an oxide of La, Mg, Y, Ba or Sr.

Example embodiment 10: The integrated circuit structure of example embodiment 7, 8 or 9, wherein the first dipole material layer or the second dipole material layer has a thickness in the range of 1-3 Angstroms.

Example embodiment 11: The integrated circuit structure of example embodiment 7, 8 or 9, wherein the first dipole material layer or the second dipole material layer has a thickness in the range of 4-6 Angstroms.

Example embodiment 12: The integrated circuit structure of example embodiment 7, 8, 9, 10 or 11, wherein the mid-gap to N-type conductive layer is continuous between the first vertical arrangement of horizontal nanowires and the second vertical arrangement of horizontal nanowires.

Example embodiment 13: A computing device includes a board, and a component coupled to the board. The component includes an integrated circuit structure including a first vertical arrangement of horizontal nanowires, and a second vertical arrangement of horizontal nanowires. A P-type gate stack is over the first vertical arrangement of horizontal nanowires, the P-type gate stack having a mid-gap to P-type conductive layer over a first gate dielectric including a high-k dielectric layer and a first dipole material layer. An N-type gate stack is over the second vertical arrangement of horizontal nanowires, the N-type gate stack having the mid-gap to P-type conductive layer over a second gate dielectric including the high-k dielectric layer and a second dipole material layer, the second dipole layer different than the first dipole material layer.

Example embodiment 14: The computing device of example embodiment 13, further including a memory coupled to the board.

Example embodiment 15: The computing device of example embodiment 13 or 14, further including a communication chip coupled to the board.

Example embodiment 16: The computing device of example embodiment 13, 14 or 15, wherein the component is a packaged integrated circuit die.

Example embodiment 17: A computing device includes a board, and a component coupled to the board. The component includes an integrated circuit structure including a first vertical arrangement of horizontal nanowires, and a second vertical arrangement of horizontal nanowires. A P-type gate stack is over the first vertical arrangement of horizontal nanowires, the P-type gate stack having a mid-gap to N-type conductive layer over a first gate dielectric including a high-k dielectric layer and a first dipole material layer. An N-type gate stack is over the second vertical arrangement of horizontal nanowires, the N-type gate stack having the mid-gap to N-type conductive layer over a second gate dielectric including the high-k dielectric layer and a second dipole material layer, the second dipole layer different than the first dipole material layer.

Example embodiment 18: The computing device of example embodiment 17, further including a memory coupled to the board.

Example embodiment 19: The computing device of example embodiment 17 or 18, further including a communication chip coupled to the board.

Example embodiment 20: The computing device of example embodiment 17, 18 or 19, wherein the component is a packaged integrated circuit die.

What is claimed is:

1. An integrated circuit structure, comprising:
a first vertical arrangement of horizontal nanowires;
a second vertical arrangement of horizontal nanowires;
a P-type gate stack over the first vertical arrangement of horizontal nanowires, the P-type gate stack having a mid-gap to P-type conductive layer over a first gate dielectric comprising a high-k dielectric layer and a first dipole material layer, the mid-gap to P-type conductive layer in direct physical contact with the first dipole material layer; and
an N-type gate stack over the second vertical arrangement of horizontal nanowires, the N-type gate stack having the mid-gap to P-type conductive layer over a second gate dielectric comprising the high-k dielectric layer and a second dipole material layer, the mid-gap to P-type conductive layer in direct physical contact with the second dipole material layer, the second dipole material layer different than the first dipole material layer, wherein the mid-gap to P-type conductive layer is continuous between the first vertical arrangement of horizontal nanowires and the second vertical arrangement of horizontal nanowires.

2. The integrated circuit structure of claim 1, wherein the high-k dielectric layer comprises hafnium and oxygen.

3. The integrated circuit structure of claim 1, wherein the first dipole material layer comprises an oxide of Al, Ti, Nb or Ga, and wherein the second dipole material layer comprises an oxide of La, Mg, Y, Ba or Sr.

4. The integrated circuit structure of claim 1, wherein the first dipole material layer or the second dipole material layer has a thickness in the range of 1-3 Angstroms.

5. The integrated circuit structure of claim 1, wherein the first dipole material layer or the second dipole material layer has a thickness in the range of 4-6 Angstroms.

6. The integrated circuit structure of claim 1, wherein the mid-gap to P-type conductive layer is continuous between the first vertical arrangement of horizontal nanowires and the second vertical arrangement of horizontal nanowires.

7. An integrated circuit structure, comprising:
a first vertical arrangement of horizontal nanowires;
a second vertical arrangement of horizontal nanowires;
a P-type gate stack over the first vertical arrangement of horizontal nanowires, the P-type gate stack having a mid-gap to N-type conductive layer over a first gate dielectric comprising a high-k dielectric layer and a first dipole material layer, the mid-gap to N-type conductive layer in direct physical contact with the first dipole material layer; and
an N-type gate stack over the second vertical arrangement of horizontal nanowires, the N-type gate stack having the mid-gap to N-type conductive layer over a second gate dielectric comprising the high-k dielectric layer and a second dipole material layer, the mid-gap to N-type conductive layer in direct physical contact with the second dipole material layer, the second dipole material layer different than the first dipole material layer, wherein the mid-gap to N-type conductive layer is continuous between the first vertical arrangement of horizontal nanowires and the second vertical arrangement of horizontal nanowires.

8. The integrated circuit structure of claim 7, wherein the high-k dielectric layer comprises hafnium and oxygen.

9. The integrated circuit structure of claim 7, wherein the first dipole material layer comprises an oxide of Al, Ti, Nb or Ga, and wherein the second dipole material layer comprises an oxide of La, Mg, Y, Ba or Sr.

10. The integrated circuit structure of claim 7, wherein the first dipole material layer or the second dipole material layer has a thickness in the range of 1-3 Angstroms.

11. The integrated circuit structure of claim 7, wherein the first dipole material layer or the second dipole material layer has a thickness in the range of 4-6 Angstroms.

12. The integrated circuit structure of claim 7, wherein the mid-gap to N-type conductive layer is continuous between the first vertical arrangement of horizontal nanowires and the second vertical arrangement of horizontal nanowires.

13. A computing device, comprising:
a board; and
a component coupled to the board, the component including an integrated circuit structure, comprising:
a first vertical arrangement of horizontal nanowires;
a second vertical arrangement of horizontal nanowires;
a P-type gate stack over the first vertical arrangement of horizontal nanowires, the P-type gate stack having a mid-gap to P-type conductive layer over a first gate dielectric comprising a high-k dielectric layer and a first dipole material layer, the mid-gap to P-type conductive layer in direct physical contact with the first dipole material layer; and
an N-type gate stack over the second vertical arrangement of horizontal nanowires, the N-type gate stack having the mid-gap to P-type conductive layer over a second gate dielectric comprising the high-k dielectric layer and a second dipole material layer, the mid-gap to P-type conductive layer in direct physical contact with the second dipole material layer, the second dipole material layer different than the first dipole material layer, wherein the mid-gap to P-type conductive layer is continuous between the first vertical arrangement of horizontal nanowires and the second vertical arrangement of horizontal nanowires.

14. The computing device of claim 13, further comprising:

a memory coupled to the board.

15. The computing device of claim 13, further comprising:

a communication chip coupled to the board.

16. The computing device of claim 13, wherein the component is a packaged integrated circuit die.

17. A computing device, comprising:

a board; and a component coupled to the board, the component including an integrated circuit structure, comprising:

a first vertical arrangement of horizontal nanowires;

a second vertical arrangement of horizontal nanowires;

a P-type gate stack over the first vertical arrangement of horizontal nanowires, the P-type gate stack having a mid-gap to N-type conductive layer over a first gate dielectric comprising a high-k dielectric layer and a first dipole material layer, the mid-gap to N-type conductive layer in direct physical contact with the first dipole material layer; and an N-type gate stack over the second vertical arrangement of horizontal nanowires, the N-type gate stack having the mid-gap to N-type conductive layer over a second gate dielectric comprising the high-k dielectric layer and a second dipole material layer, the mid-gap to N-type conductive layer in direct physical contact with the second dipole material layer, the second dipole material layer different than the first dipole material layer, wherein the mid-gap to N-type conductive layer is continuous between the first vertical arrangement of horizontal nanowires and the second vertical arrangement of horizontal nanowires.

18. The computing device of claim 17, further comprising:

a memory coupled to the board.

19. The computing device of claim 17, further comprising:

a communication chip coupled to the board.

20. The computing device of claim 17, wherein the component is a packaged integrated circuit die.

\* \* \* \* \*